United States Patent
Ootera et al.

(10) Patent No.: US 9,293,696 B2
(45) Date of Patent: Mar. 22, 2016

(54) MAGNETIC MEMORY AND SHIFT REGISTER MEMORY

(71) Applicant: KABUSHIKI KAISHA TOSHIBA, Tokyo (JP)

(72) Inventors: Yasuaki Ootera, Kanagawa (JP); Takuya Shimada, Kanagawa (JP); Tsuyoshi Kondo, Kanagawa (JP); Hirofumi Morise, Kanagawa (JP); Michael Arnaud Quinsat, Kanagawa (JP); Shiho Nakamura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/704,359

(22) Filed: May 5, 2015

(65) Prior Publication Data

US 2015/0380638 A1 Dec. 31, 2015

(30) Foreign Application Priority Data

Jun. 25, 2014 (JP) .................................. 2014-130799

(51) Int. Cl.
*H01L 29/82* (2006.01)
*H01L 43/08* (2006.01)
*H01L 43/02* (2006.01)
*H01L 27/22* (2006.01)

(52) U.S. Cl.
CPC .............. *H01L 43/08* (2013.01); *H01L 27/226* (2013.01); *H01L 43/02* (2013.01)

(58) Field of Classification Search
CPC ........ H01L 43/08; H01L 43/02; H01L 27/226
USPC ....................................................... 257/421
See application file for complete search history.

(56) References Cited

U.S. PATENT DOCUMENTS

| 6,834,005 | B1 | 12/2004 | Parkin | |
|---|---|---|---|---|
| 2004/0252539 | A1 | 12/2004 | Parkin | |
| 2006/0215443 | A1* | 9/2006 | Katti | G11C 11/16 365/158 |
| 2009/0168506 | A1* | 7/2009 | Han | B82Y 25/00 365/171 |
| 2010/0128510 | A1* | 5/2010 | Cowburn | B82Y 10/00 365/80 |
| 2013/0005053 | A1 | 1/2013 | Joseph et al. | |
| 2013/0235653 | A1 | 9/2013 | Kondo et al. | |
| 2015/0054058 | A1* | 2/2015 | Seol | H01L 29/42332 257/324 |

FOREIGN PATENT DOCUMENTS

| JP | 2010-229506 | 10/2010 |
|---|---|---|
| JP | 2013-187257 | 9/2013 |

OTHER PUBLICATIONS

Gorisse et al.; "Highly Organised and Dense Vertical Silicon Nanowire Arrays Grown in Porous Alumina Template on <100> Silicon Wafers", Nanoscale Research Letters, vol. 8, No. 287, pp. 1-9, (2013).

* cited by examiner

*Primary Examiner* — Trung Q Dang
(74) *Attorney, Agent, or Firm* — Finnegan, Henderson, Farabow, Garrett & Dunner, L.L.P.

(57) ABSTRACT

According to one embodiment, a magnetic memory includes a first magnetic unit, a first magnetic layer, a first recording/reproducing element, a first electrode, and a second electrode. The first magnetic unit extends in a first direction. The first magnetic unit includes a plurality of magnetic domains arranged in the first direction. The first magnetic unit has a columnar configuration having a hollow portion. The first magnetic layer is connected to a first end portion of the first magnetic unit, the first magnetic layer extends in a direction intersecting the first direction. The first recording/reproducing element is provided in contact with the first magnetic layer. The first electrode is electrically connected to the first magnetic layer. The second electrode is connected to a second end portion of the first magnetic unit on a side opposite to the first end portion.

20 Claims, 16 Drawing Sheets

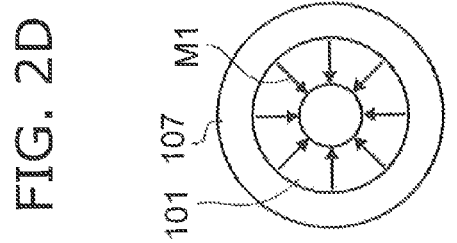
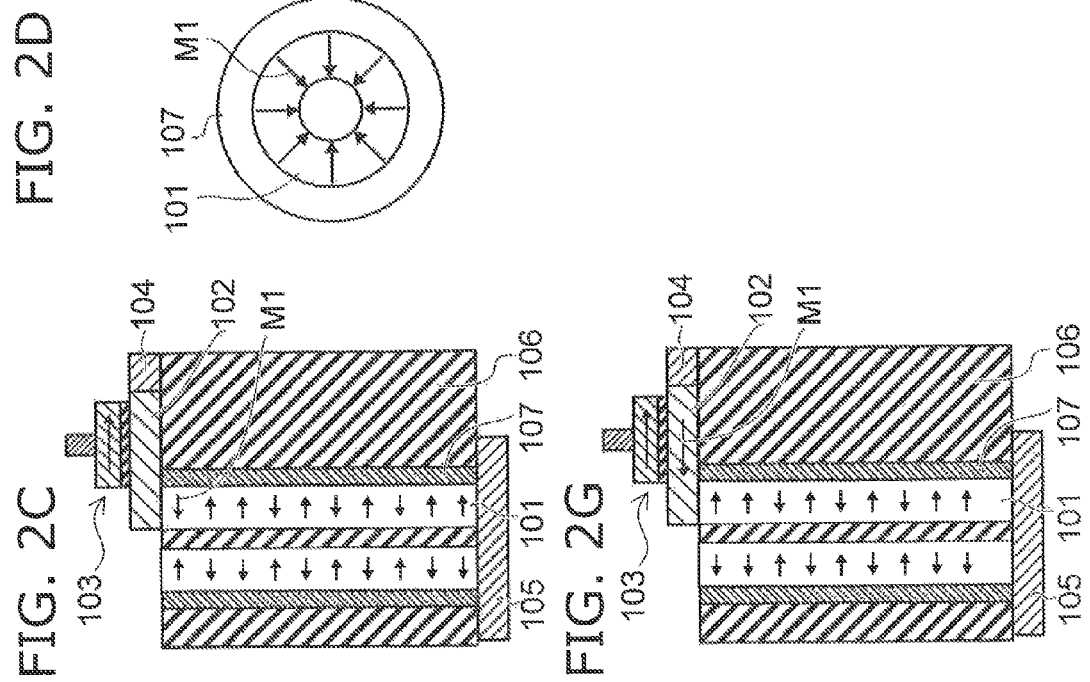
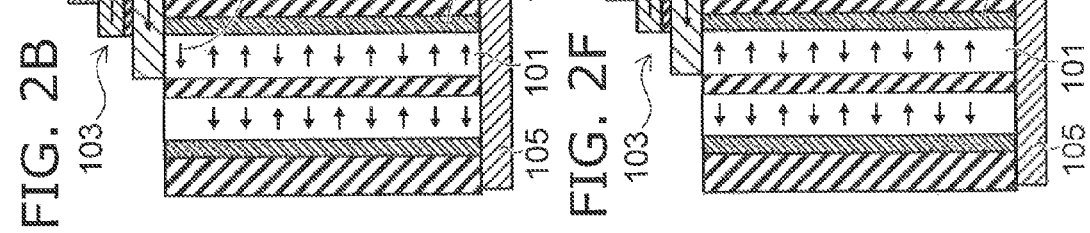
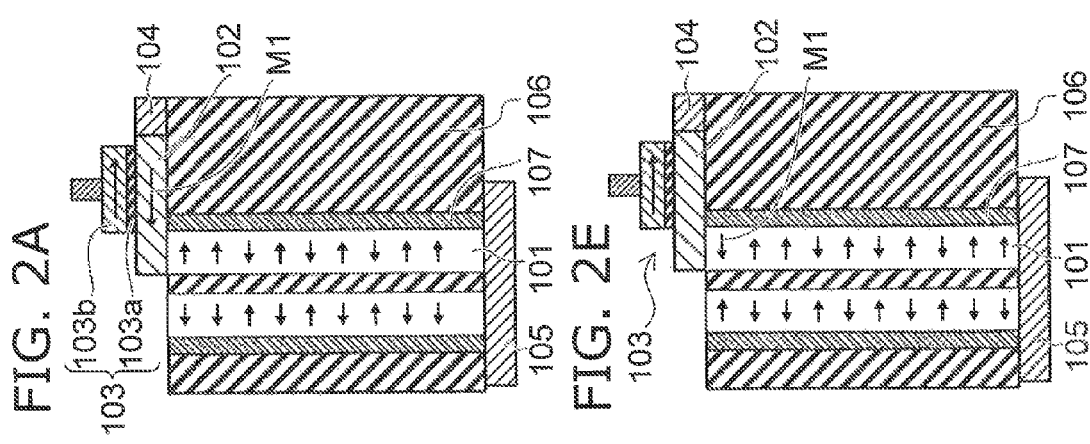

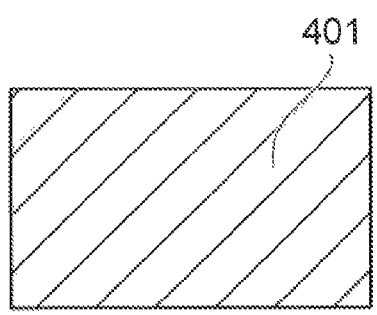
FIG. 7A
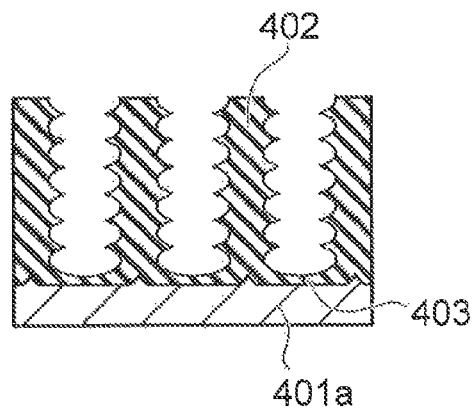
FIG. 7B
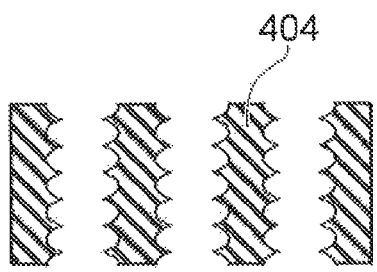
FIG. 7C
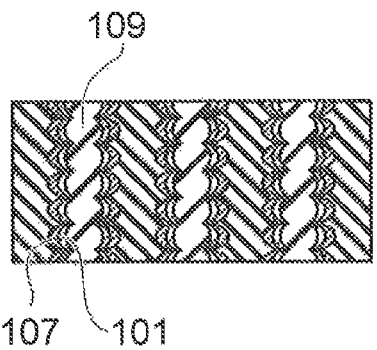
FIG. 7D
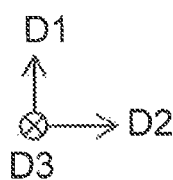

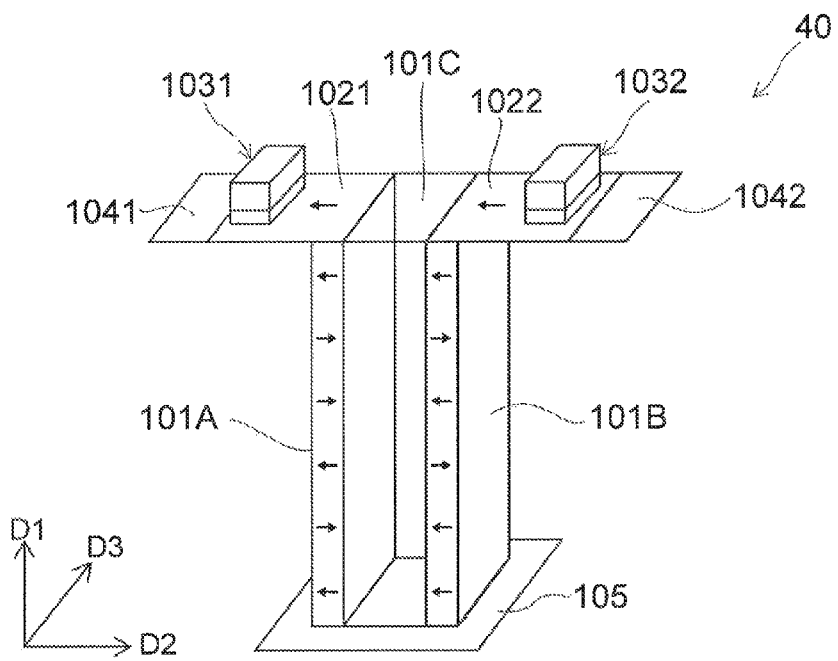
FIG. 8
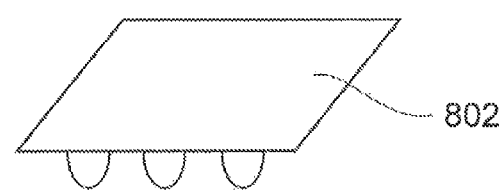
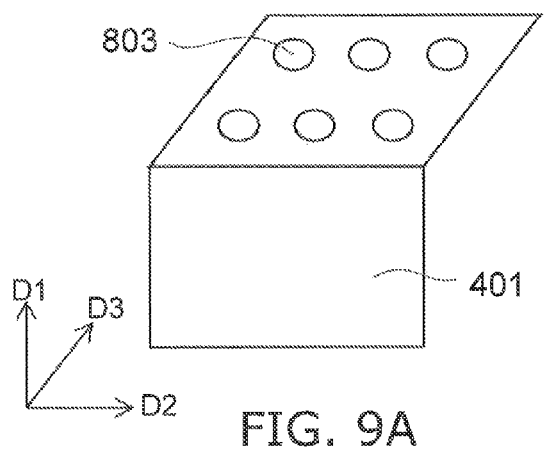
FIG. 9A
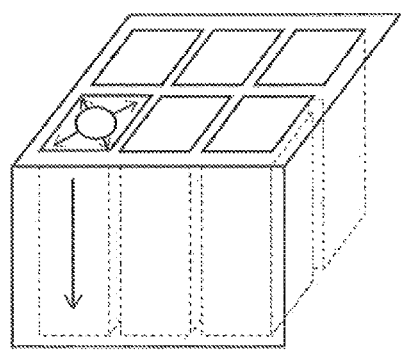
FIG. 9B

MAGNETIC MEMORY AND SHIFT REGISTER MEMORY

CROSS-REFERENCE TO RELATED APPLICATIONS

This application is based upon and claims the benefit of priority from Japanese Patent Application No.2014-130799, filed on Jun. 25, 2014; the entire contents of which are incorporated herein by reference.

FIELD

Embodiments described herein relate generally to a magnetic memory and a shift register memory.

BACKGROUND

In recent years, a phenomenon has been reported in which the domain walls in a magnetic wire are moved by causing a current to flow in the wire. Attempts are being made to make magnetic memory by utilizing this phenomenon. In such attempts, a wire that is formed of a magnet, an element that writes the domain walls to the magnetic wire, and an element that senses the direction of the magnetization are provided. Electrodes are provided at two ends of the magnetic wire; and the domain walls that are written are shifted by causing a current to flow in the magnetic wire. Similarly to other magnetic recording devices such as hard disks, etc., the information is recorded by the magnetization direction of the magnetic domain partitioned by the domain walls.

In the magnetic memory using the magnetic wire, it is desirable to develop technology for writing and reproducing the magnetic domain with high precision.

BRIEF DESCRIPTION OF THE DRAWINGS

FIGS. 2A to 2G are schematic views showing the operations of the magnetic memory according to the first embodiment;

FIGS. 7A to 7D are cross-sectional views of processes, showing manufacturing processes of the magnetic unit;

FIG. 8 is a perspective view of the magnetic memory according to the fourth embodiment;

FIGS. 9A and 9B are cross-sectional views of processes, showing manufacturing processes of the magnetic memory according to the fifth embodiment;

DETAILED DESCRIPTION

According to one embodiment, a magnetic memory includes a first magnetic unit, a first magnetic layer, a first recording/reproducing element, a first electrode, and a second electrode. The first magnetic unit extends in a first direction. The first magnetic unit includes a plurality of magnetic domains arranged in the first direction. The first magnetic unit has a columnar configuration having a hollow portion. The first magnetic layer is connected to a first end portion of the first magnetic unit, the first magnetic layer extends in a direction intersecting the first direction. The first recording/reproducing element is provided in contact with the first magnetic layer. The first electrode is electrically connected to the first magnetic layer. The second electrode is connected to a second end portion of the first magnetic unit on a side opposite to the first end portion.

A magnetic memory 10 according to the embodiment will now be described using FIG. 1.

Figure 1:
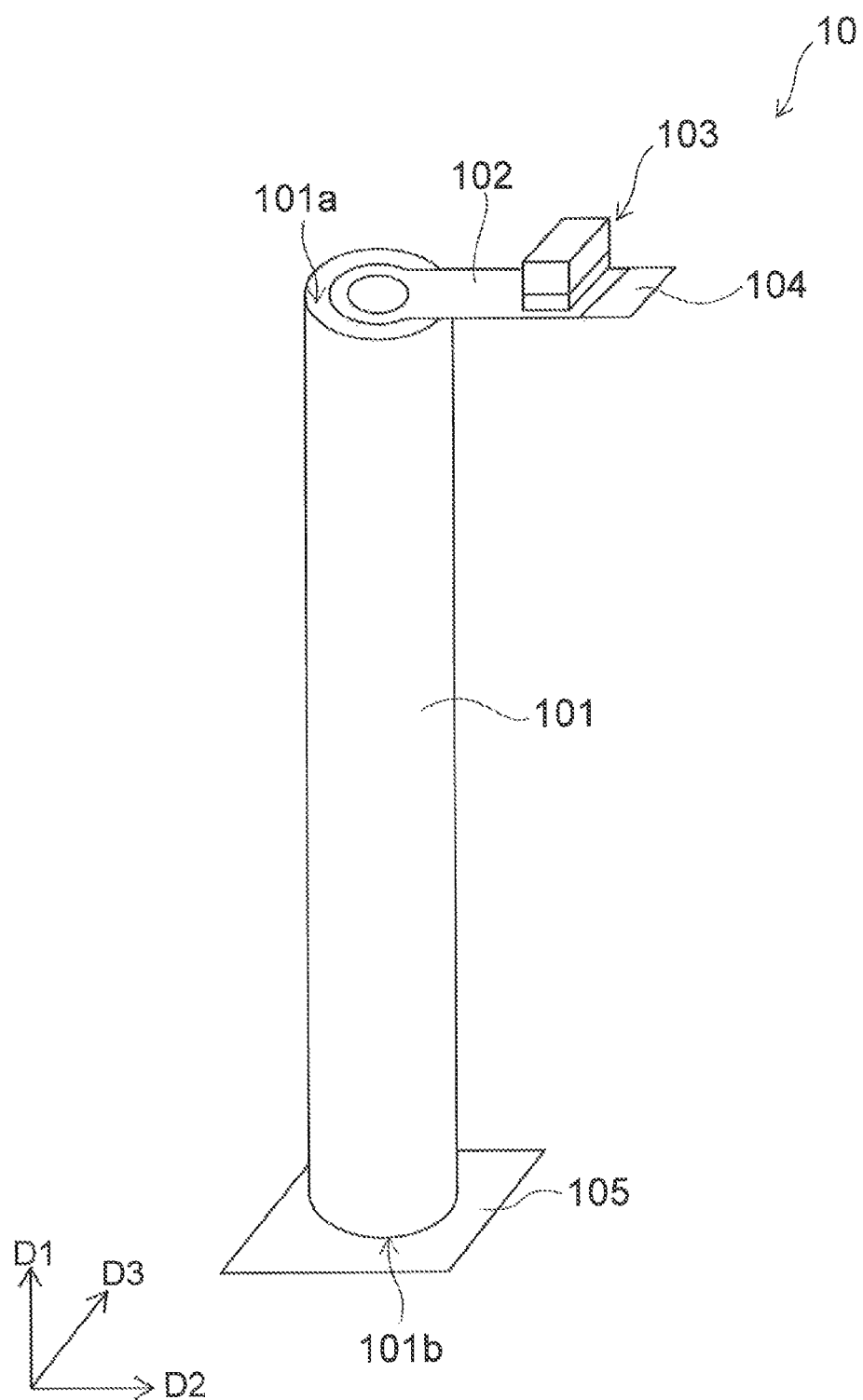
FIG. 1 is a perspective view of the magnetic memory according to the first embodiment.

FIG. 1 is a perspective view of the magnetic memory 10 according to the first embodiment.

In the description of magnetic layers of the embodiments, a layer having magnetization in the inner-plane direction is called an inner-plane magnetization layer; and a layer having magnetization in a direction perpendicular to the inner-plane direction is called a perpendicular magnetization layer.

As shown in FIG. 1, the magnetic memory 10 includes a magnetic unit 101 (a first magnetic unit). The magnetic unit 101 extends in a first direction and includes multiple magnetic domains in the first direction. The magnetic unit 101 also has a hollow portion extending in the first direction. A nonmagnet 109 is filled into the hollow portion of the magnetic unit 101. In the embodiment, the magnetic unit 101 has a cylindrical configuration.

A magnetic layer (a first magnetic layer) 102 that extends in a second direction intersecting the first direction is connected to a first end portion 101a of the magnetic unit 101. A recording/reproducing element (a first recording/reproducing element) 103 is provided in contact with the magnetic layer 102. The magnetic layer 102 is electrically connected to an electrode (a first electrode) 104. The electrode 104 is provided so that the portion of the magnetic layer 102 contacting the recording/reproducing element 103 is positioned in the current path between the electrode 104 and the magnetic unit 101. In other words, it is sufficient for the portion of the magnetic layer 102 where the recording/reproducing element 103 is provided to exist in the current path between the electrode 104 and the portion of the magnetic layer 102 connected to the magnetic unit 101. The magnetic layer 102 may be electrically connected to the electrode 104 via another member. An electrode 105 (a second electrode) is provided at a second end portion 101b of the magnetic unit 101 on the side opposite to the side connected to the magnetic layer 102.

The first direction is, for example, a direction D1 of FIG. 1. The second direction is, for example, a direction D2 of FIG. 1. In the embodiment, the first direction is orthogonal to the second direction.

In the description of the embodiments hereinbelow, the side of the magnetic unit 101 where the magnetic layer 102 is provided is described as up (upward); and the side where the electrode 105 is provided is described as down (downward).

The magnetic unit 101 includes, for example, a multilayered film including cobalt, nickel, etc. Other than cobalt and nickel, it is also possible to use an alloy selected from iron, cobalt, platinum, and rare-earth elements as the material of the magnetic unit 101.

The magnetic layer 102 includes a magnetic material such as iron, cobalt, etc.

The recording/reproducing element 103 includes, for example, a MTJ (Magnetic Tunnel Junction) element.

The magnetic memory according to the embodiment is a nonvolatile magnetic memory that stores information by recording, in the magnetic unit, magnetic domains having magnetization directions corresponding to the information. A shift register memory is made to reproduce the target information by moving the magnetic domains enclosed with domain walls to the position of the recording/reproducing element by moving the domain walls by causing a current to flow in the magnetic unit. To provide high-density recording, perpendicular magnetic recording is desirable to make the widths of the domain walls narrow. In the magnetic memory according to the embodiment as well, the magnetic unit has a columnar configuration having a hollow portion and includes a perpendicular magnetization layer having the easy magnetization axis in the diametrical direction.

However, conventionally, there was no effective method for writing and reproducing the magnetic domains to and from the magnetic unit having the columnar configuration. Conversely, in the embodiment, the magnetic unit that has the columnar configuration having the hollow portion is connected to the magnetic layer; and the recording and reproducing of the magnetic domains is performed by the magnetic layer.

For the magnetic layer 102, a magnetization direction due to a single magnetic domain is shown in the drawings. However, multiple magnetic domains may exist in the magnetic layer 102.

Operations of the magnetic memory 10 according to the embodiment will now be described using FIGS. 2A to 2G.

FIGS. 2A to 2G are schematic views showing the operations of the magnetic memory 10 according to the first embodiment.

For example, the writing of the magnetic domain is performed to the magnetic layer 102 using the recording/reproducing element 103 such as the MTJ element, etc. (FIG. 2A). In such a case, the electrode 104 may be used as the write electrode. Here, a magnetic domain M1 is written to the magnetic layer 102 by the recording/reproducing element 103.

Then, the magnetic domain M1 that is recorded is moved from the magnetic layer 102 into the magnetic unit 101 including the perpendicular magnetization layer by causing a current to flow from the electrode 105 in the direction of the electrode 104. FIG. 2B shows the state partway through moving the recorded magnetic domain from the magnetic layer 102 into the magnetic unit 101; and FIG. 2C shows the state after the magnetic domain is moved into the magnetic unit 101.

At this time, the domain wall can be moved back and forth between the inner-plane magnetization layer and the perpendicular magnetization layer by a low drive current. Therefore, although it is desirable for the magnetic layer 102 to be an inner-plane magnetization layer, the magnetic layer 102 may be a perpendicular magnetization layer if the curvature of the connection portion is sufficiently large or a large drive current can be provided. The direction of the easy magnetization axis of the magnetic layer included in the magnetic unit 101 is the direction from the outer wall of the magnetic unit 101 toward the hollow portion, i.e., the diametrical direction of the circular tube. Therefore, a magnetic domain that has a ring configuration having a magnetization direction in the central direction or the outer circumferential direction is stably formed. The state at this time is shown in FIG. 2D. Thus, the perpendicular magnetic recording of the magnetic domains is possible for the magnetic unit 101.

The reproducing of the magnetic domain will now be described. The reproducing of the magnetic domain also is performed similarly from the magnetic layer 102 using the recording/reproducing element 103 such as the MTJ element, etc. Here, the case where the magnetic domain M1 recorded in the magnetic unit 101 is reproduced by the recording/reproducing element 103 will be described (FIG. 2E).

First, the magnetic domain M1 that is recorded in the perpendicular magnetization layer included in the magnetic unit 101 is moved toward the magnetic layer 102 by causing a current to flow from the electrode 104 toward the electrode 105 (FIG. 2F). Similar to the writing, it is desirable for the magnetic layer 102 to be an inner-plane magnetization layer.

Then, the magnetization direction of the magnetic domain M1 of the magnetic layer 102 is reproduced by the recording/reproducing element 103 (FIG. 2G). Thus, the reproduction of the magnetization direction of the magnetic domain having perpendicular magnetic recording in the magnetic unit is possible.

In the case where the recording/reproducing is performed by the MTJ element, the recording/reproducing element 103 is configured so that a pinned layer 103b made of a ferromagnet contacts the magnetic layer 102 via a tunneling barrier layer 103a. In the embodiment, the magnetic unit 101 includes a foundation layer 107 at the outer circumference of the magnetic unit 101 because the magnetic unit 101 includes the perpendicular magnetization layer. The periphery of the magnetic unit 101 and the foundation layer 107 is covered with a nonmagnetic insulator 106. It is favorable for a nonmagnet to be provided in the hollow portion of the magnetic unit 101.

In the case where shift registers are integrated to be used as memory having a large capacity, it is desirable for the magnetic unit to stand perpendicularly to reduce the dedicated surface area per bit. In such a case, because the electrodes at the two ends of the magnetic unit and the accompanying interconnects, etc., are formed on a substrate, a structure is used in which the magnetic unit stands perpendicularly to the substrate. However, because the target density of next-generation memory includes a magnetic unit having a width on the order of several tens of nm and a length on the order of μm, for example, it is difficult to self-supportingly grow the magnetic units perpendicularly. Therefore, a method for forming the magnetic units has been proposed in which first, an arrangement of holes is made; and a magnet is filled into the hole arrangement. Thus, a structure is possible in which magnetic units having high aspect ratios are arranged to stand perpendicularly on the substrate; and it is being attempted to realize a higher-capacity shift register memory in three-dimensional directions.

The perpendicular magnetic recording that can provide a narrow width of the domain wall between the magnetic domains is effective for recording the information, i.e., the magnetic domains, with high density in the magnetic unit. A method may be considered for controlling the crystal structure of the magnetic layer by the foundation layer to provide perpendicular magnetization to the magnetic layer. To this end, it is desirable for the magnetic unit to be formed of a multilayered film of the foundation layer and the magnetic layer.

As a first reference example, a magnetic memory may be considered in which the information is recorded by writing magnetic domains in a magnet having a cylindrical configuration, where the easy magnetization axis of the magnetic layer is the circumferential direction of the circular tube. However, actually, it is difficult to set the easy magnetization axis to be in the circumferential direction of the circular tube.

For the magnetic unit of the embodiment, the magnetic unit has a columnar configuration extending in the first direction; high-density recording is possible; the manufacturing is relatively easy; and the easy magnetization axis is in a direction orthogonal to the first direction.

According to the embodiment, the reproducing and writing of the information from and to the magnetic unit 101 having the columnar configuration can be performed easily by reproducing and writing the information from and to the magnetic unit 101 by using the magnetic layer 102 and the recording/reproducing element 103 provided on the magnetic layer 102.

Also, it is possible to favorably apply the embodiment to a magnetic unit in which the easy magnetization axis is in a direction other than the diametrical direction by using the magnetic layer 102 and the recording/reproducing element 103 provided on the magnetic layer 102.

A method for manufacturing the magnetic memory according to the first embodiment will now be described using FIGS. 3A to 3G.

FIGS. 3A to 3G are cross-sectional views of processes, showing manufacturing processes of the magnetic memory 10.

An example of the dimensions for a racetrack magnetic memory in which information of about 10 Tbits is recorded in a chip having a surface area of 100 mm$^2$ is described below.

In the case where perpendicular magnetic recording is used, it is possible for the magnetic domain used as one bit to have a minimum length of about 30 nm. Considering current technology for forming electrodes, interconnects, etc., by conventional lithography using light or an electron beam, it is considered that it is desirable for the pitch of the recording/reproducing elements to be about 60 nm. Therefore, it is desirable also for the pitch of the magnetic units connected to the recording/reproducing elements to be about 60 nm. To record information having a density of 10 Tbit/100 mm$^2$ in an arrangement of magnetic units provided at a spacing of 60 nm, it is necessary to record about 300 bits of information in one magnetic unit. In the case where one bit is about 30 nm, the length of the magnetic unit is about 10 µm; and the aspect ratio of the magnetic unit is about 300. To achieve a recording density of one bit per 30 nm, it is desirable for the magnetic unit to include a so-called perpendicular magnetization layer in which the easy magnetization axis direction is a direction perpendicular to the direction in which the magnetic unit extends. To this end, for example, it is desirable to use a multilayered structure in which platinum or the like is used as the foundation layer; and a single-layer film of cobalt, iron, nickel, etc., an alloy film including these materials, or a stacked film in which multiple single-layer films and/or alloy films are stacked is formed on the foundation layer.

As described above, to increase the recording density per surface area and reduce as much as possible the number of times lithography must be performed when forming the recording/reproducing elements, a three-dimensional structure is effective in which the recording/reproducing elements are made on a plane and the magnetic units which are the record carriers are provided perpendicularly to the plane. However, it is difficult to make such high-aspect magnetic units that are fine and perpendicularly self-supporting.

Therefore, the making of an arrangement of the magnetic units by making an arrangement of high-aspect holes and forming a magnetic material as a film in the holes is being studied. Generally, in the field of semiconductor manufacturing, as the method for making the arrangement of high-aspect holes, the holes are made by dry etching; redeposition (etching debris) that is produced in the dry etching protects the side walls of the holes; and the excavating progresses using a Bosch process. However, even when such a method is used, currently it is difficult to make holes having such a high aspect ratio by methods using dry etching such as reactive ion etching, milling, etc.

In the manufacturing method according to the embodiment, the arrangement of high-aspect holes is made by a wet etching process using anodic oxidation. Of course, the dry etching process described above may be used according to the dimensions; or, an arrangement of holes and an arrangement of low-aspect magnetic units may be repeatedly stacked to obtain the high aspect ratio. When stacking is used, conventional lithography, etching, directed self-assembly lithography using a copolymer, etc., also may be used. Further, for example, metal-assisted chemical etching in which a noble metal catalyst is used and selective high-aspect etching of a silicon substrate performed by hydrofluoric acid, a hydrogen peroxide solution, etc., may be used.

The method for making the magnetic memory 10 using anodic oxidation will now be described.

Figure 3A:
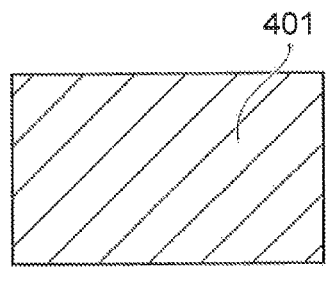
FIGS. 3A to 3G are cross-section& views of processes, showing manufacturing processes of the magnetic memory according to the first embodiment.

First, as the base member, a substrate 401 of a metal such as aluminum, etc., is prepared (FIG. 3A).

Figure 3B:
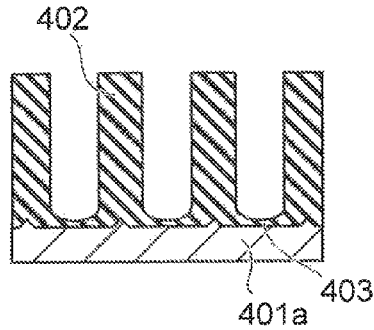

Then, using the substrate 401 as an anode, conduction in an electrolyte solution (sulfuric acid, oxalic acid, phosphoric acid, etc.) is performed (FIG. 3B). At this time, the anode metal is oxidized, becomes metal ions, and dissolves. The metal ions bond with the oxygen in the liquid to form a metal oxide and remain by growing on the anode metal surface. In other words, at this time, an oxide (alumina) 402 grows on the substrate 401. At this time, the dissolution and the growth progress simultaneously to make fine holes of alumina that are arranged in the aluminum surface of the anode. The dimensions of the holes are determined by the aluminum purity, the voltage, the electrolyte solution, and the processing time. For example, an arrangement of holes without branching having a diameter of 20 nm, a pitch of 60 nm, and a depth of 10 µm are made in the case where sulfuric acid is used in processing for several tens of minutes at several tens of volts for an aluminum substrate having a purity of 99.995% or more.

Figure 3C:
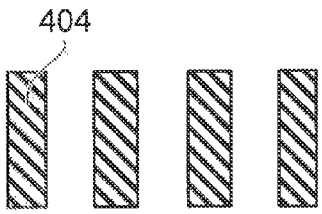

A barrier layer 403 exists on the substrate when performing the anodic oxidation. Therefore, it is difficult for the holes made by the anodic oxidation to become through-holes. However, in the magnetic memory 10, it is desirable for through-holes to be made because electrodes and/or elements are provided at the two ends of the magnetic unit 101. Therefore, processing of the substrate subjected to anodic oxidation is performed to make the membrane having through-holes by, for example, dissolution and peeling of an unreacted substrate 401a by an iodine-methanol solution and subsequently using a strong acid to dissolve the barrier layer 403 (FIG. 3C). The detached anodic oxidation alumina portion is used as an alumina membrane 404 having the arrangement of through-holes. Planarization, e.g., CMP (chemical mechanical polishing), etc., may be used to planarize the membrane surface. Or, the planarization may be performed after the magnetic material film formation described below.

The magnetic unit 101 is made by, for example, using a method such as CVD, etc., to form a magnetic material as a film on the arrangement of through-holes made by the anodic oxidation. Although a film formation method such as CVD, plating, etc., is desirable to perform the film formation for the high-aspect holes, a film formation method such as sputtering, vapor deposition, etc., may be used.

Figure 3D:
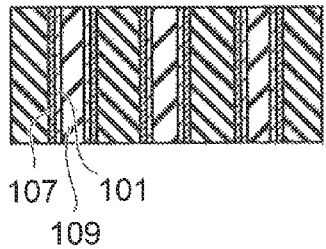

To form the perpendicular magnetization layer, it is desirable to form the foundation layer 107 prior to forming the magnetic material as a film. Because the hole has a circular columnar configuration, the magnetic unit 101 and the foundation layer 107 that are formed have concentric circular configurations when the cross section is viewed. At this time, the magnetic unit 101 has an easy magnetization axis in the direction (i.e., the diametrical direction) from the outer wall of the hole toward the center of the hole. The foundation layer 107 is formed by, for example, forming Pt as a film on the hole inner wall by CVD. The magnetic unit 101 is formed on the foundation layer 107 by, for example, sequentially stacking a film including Co and a film including Ni using CVD. Subsequently, the insulative nonmagnet 109 (e.g., alumina or silicon oxide) is filled into the hollow portion (FIG. 3D).

The alumina, being an insulator, is favorable because it is necessary for the arrangement of magnetic units that is made to be electrically insulated from each other. The anodic oxidation also is possible by performing processing using hydrofluoric acid as the electrolyte solution and a silicon substrate as the base member. In such a case, the arrangement of holes is made in silicon oxide. In the case where the silicon substrate is used, the holes can be made directly in the silicon substrate in which semiconductor elements such as transistors, etc., are provided.

Thus, the alumina substrate that includes the arrangement of the magnetic units 101 is made by forming the magnetic material as a film on the inner walls of the through-holes of the alumina membrane 404. In the embodiment, the magnetic layer 102 is connected to the end of the magnetic unit. The recording/reproducing element 103 is provided on the magnetic layer 102. The electrode 104 is provided at an end portion of the magnetic layer 102 on the side opposite to the end portion connected to the magnetic unit 101. These components are made by, for example, performing a lithography process on the alumina membrane 404.

Figure 3E:
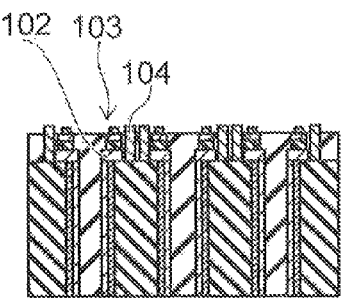
Figure 3F:
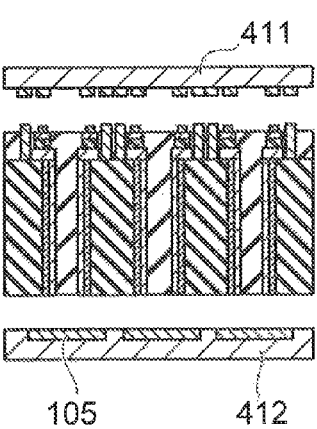

The manufacturing process of the magnetic layer 102 and subsequent manufacturing processes will now be described. First, the magnetic layer 102 is formed on the alumina membrane 404; lithography is performed; and the unnecessary portions are removed by etching such as milling, etc., lift-off, etc. Then, the electrode 104 is provided similarly. Further, as the recording/reproducing element 103, for example, a tunneling barrier layer and a pinned layer made of a ferromagnet of a MTJ element are provided (FIG. 3E). Subsequently, the interconnects, the transistors, etc., may be provided on the alumina membrane 404; or a substrate 411 on which the interconnects and the transistors are provided may be adhered and bonded to the alumina membrane 404. Similarly, an electrode 412 is formed on the backside of the alumina membrane 404; and the interconnects, the transistors, etc., are similarly provided (FIG. 3F).

Figure 3G:
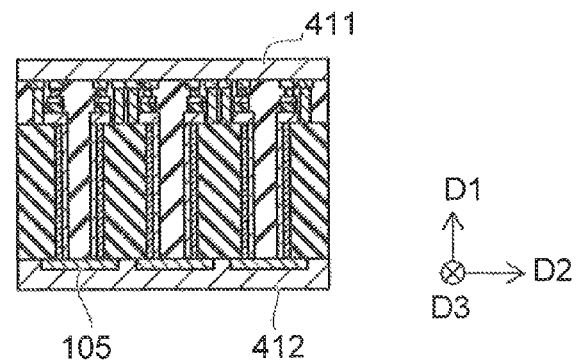

Thus, as shown in FIG. 3G, the magnetic memory 10 of the embodiment is obtained in which the magnetic layer 102 is connected to the magnetic unit 101. Perpendicular magnetic recording is effective for increasing the recording density by magnetizing the magnetic unit 101 perpendicularly to the direction in which the magnetic unit 101 extends. It is possible to favorably perform perpendicular magnetic recording of the magnetic unit 101 by forming the magnetic unit 101 having the columnar configuration on the foundation layer 107 having the columnar configuration extending in the first direction. The recording and reproducing of the magnetic domains to and from the magnetic unit 101 can be performed easily by connecting the magnetic layer 102 to the magnetic unit 101.

Second Embodiment

A shift register memory 1 according to a second embodiment will now be described using FIG. 4.

Figure 4:
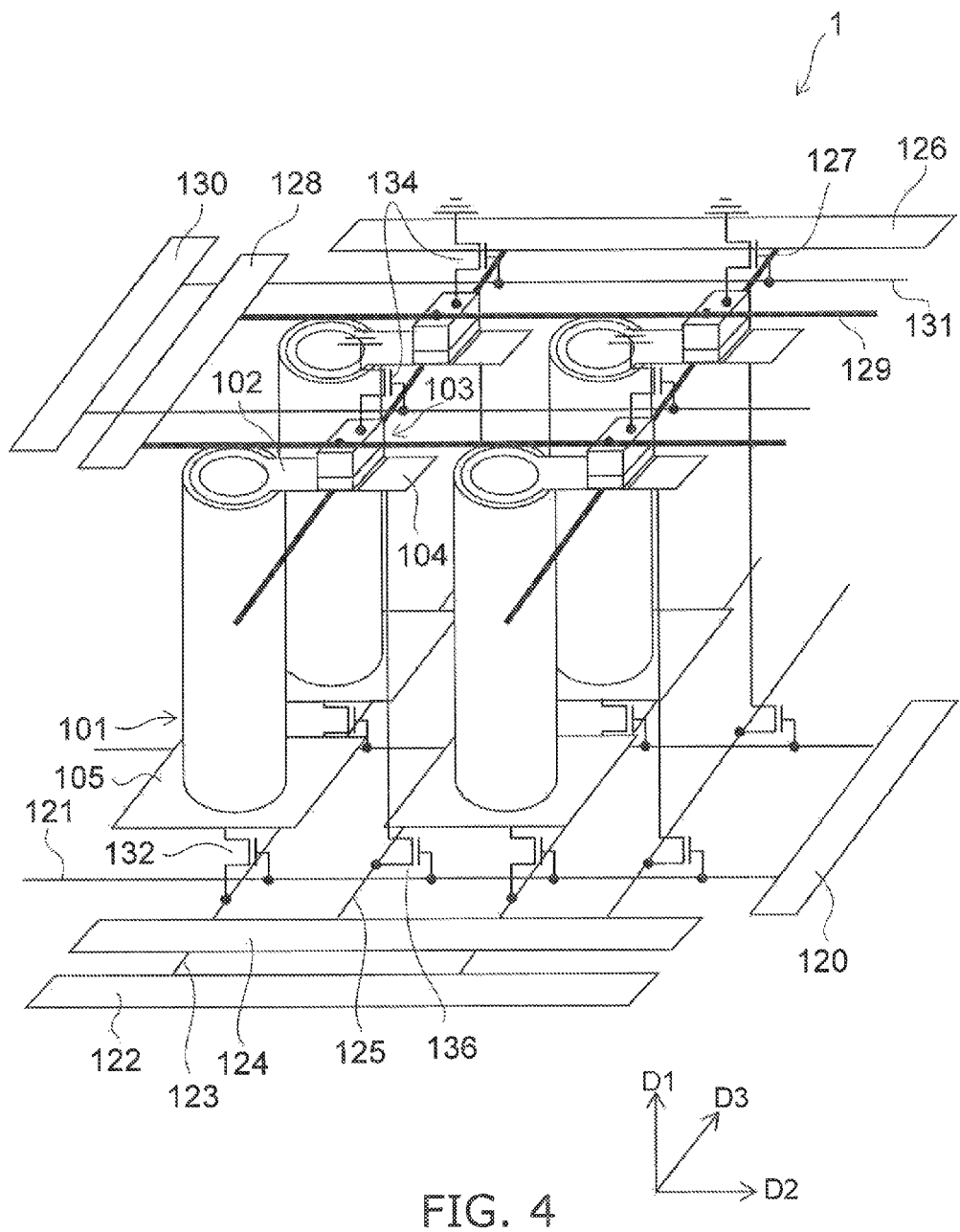
FIG. 4 is a schematic view of the shift register memory according to the second embodiment.

FIG. 4 is a schematic view of the shift register memory according to the second embodiment.

As shown in FIG. 4, the shift register memory 1 is a three-dimensional memory in which, as one unit, the magnetic unit 101, the magnetic layer 102, the recording/reproducing element 103, the electrode 104, and the electrode 105 that are included in the magnetic memory 10 according to the first embodiment are arranged in an array configuration in the row direction and the column direction.

Although the magnetic memory 10 is provided to be multiply arranged in the row direction and the column direction in the embodiment, the magnetic memory 10 may be provided in only one column in the row direction or the column direction.

The row direction is, for example, the direction D2 shown in FIG. 4. The column direction is, for example, a direction D3 shown in FIG. 4.

The shift register memory 1 has a structure in which the magnetic units 101 extend in the perpendicular direction on a substrate, and the magnetic units 101 are multiply provided in the inner-plane direction. For example, in the case where the memory capacity is on the order of 10 Tb/chip, the spacing between mutually-adjacent magnetic units is about 60 nm; and the length of the magnetic unit is about 10 μm.

The shift register memory 1 includes a first common gate line selector 120, a lower electrode selector 122, an upper electrode selector 124, a bit line selector 126, a word line selector 128, and a second common gate line selector 130.

The first common gate line selector 120 is connected to multiple first common gate lines 121 extending in the second direction. The lower electrode selector 122 is connected to multiple first common interconnects 123 extending in the third direction. The upper electrode selector 124 is connected to multiple second common interconnects 125 extending in the third direction. The bit line selector 126 is connected to multiple bit lines 127 extending in the third direction. The word line selector 128 is connected to multiple word lines 129 extending in the second direction. The second common gate line selector 130 is connected to multiple second common gate lines 131 extending in the second direction.

The shift register memory 1 includes multiple first transistors 132, multiple second transistors 134, and multiple third transistors 136.

The first transistors 132 and the third transistors 136 are provided below the magnetic unit 101. The second transistors 134 are provided above the magnetic unit 101.

The gate of the first transistor 132 is connected to the first common gate line 121. One of the terminals of the first transistor 132 other than the gate is connected to the first common interconnect 123; and the other is connected to the corresponding electrode 105.

The gate of the second transistor 134 is connected to the second common gate line 131. One of the terminals of the second transistor 134 other than the gate is connected to the corresponding recording/reproducing element 103; and the other is connected to a fixed potential (e.g., a ground potential). The terminal of the second transistor 134 that is connected to the recording/reproducing element 103 is connected to the side opposite to the side where the magnetic layer 102 is provided.

The gate of the third transistor 136 is connected to the first common gate line 121. One of the terminals of the third transistor 136 other than the gate is connected to the second common interconnect 125; and the other is connected to the electrode 104.

First, an operation of moving the magnetic domains of the magnetic unit 101 will be described.

A prescribed first common gate line 121 is selected by the first common gate line selector 120. Then, a prescribed first common interconnect 123 is selected by the lower electrode selector 122; and a prescribed second common interconnect 125 is selected by the upper electrode selector 124. By this operation, the electrode 104 and the electrode 105 that are connected to the two ends of the magnetic unit 101 of the target address position are selected; and a shift current for moving the domain walls flows between the electrode 104 and the electrode 105. The shift operation of the domain walls is performed while reproducing the magnetization direction of each of the magnetic domains one bit at a time until the magnetic domain of the target address position comes to the position of the magnetic layer 102 contacting the recording/reproducing element 103. The bits that are reproduced wait temporarily in a not-shown register or are recorded in another magnetic unit 101. This method is used because the shift register memory according to the embodiment performs destructive read-out (as the magnetic domains move in the reproducing element direction, the magnetic domain information at the end is lost).

The case where the information is written to the magnetic unit 101 will now be described.

When writing the information, the domain walls of the magnetic unit 101 are moved using the first common gate line selector 120, the lower electrode selector 122, and the upper electrode selector 124 so that the magnetic domain of the target address position moves to the position of the magnetic layer 102 contacting the recording/reproducing element 103. After the magnetic domain of the target address position is moved to the position of the magnetic layer 102, the prescribed bit line 127 is selected by the bit line selector 126; and the prescribed word line 129 is selected by the word line selector 128. The recording/reproducing element 103 that is adjacent to the magnetic layer 102 to which the information is to be written is selected from the multiple recording/reproducing elements 103; and the writing of the information to the magnetic layer 102 is performed. At this time, a current flows in the word line 129 in the direction corresponding to the information (0/1) to be recorded. The magnetic domain of the prescribed magnetization direction is formed in the magnetic layer 102 according to the direction of the current flowing in the word line 129; and the information is recorded.

Thus, the recording may be performed by a spin injection method using the bit line 127 and the word line 129, or may be performed by the spin injection method using the word line 129 and the electrode 105 described in the first embodiment. Or, the writing of the magnetic layer 102 may be performed by insulating the bit line 127 and the word line 129 from the recording/reproducing element 103 and using a current/magnetic field method.

The reproducing of the information from the magnetic unit 101 will now be described.

When reproducing the information, the domain walls of the magnetic unit 101 are moved using the first common gate line selector 120, the lower electrode selector 122, and the upper electrode selector 124 so that the magnetic domain of the target address position moves to the position of the magnetic layer 102 contacting the recording/reproducing element 103. Then, the magnetic layer 102 having the information to be reproduced is selected from the multiple magnetic layers 102 by the bit line selector 126 selecting the prescribed bit line 127 and the second common gate line selector 130 selecting the prescribed second common gate line 131; and the reproducing is performed.

At this time, the current that flows in the bit line 127 changes due to whether or not the magnetization direction of the pinned layer 103$b$ of the recording/reproducing element 103 and the magnetization direction of the magnetic domain of the magnetic layer 102 are the same direction. Thereby, it is possible to sense the magnetization direction of the recorded magnetic domain and reproduce the information (0/1). Thus, the reproducing may be performed using the bit line 127 connected to the magnetic layer 102 and the second common gate line 131 connected to the recording/reproducing element 103 or by using the electrode 105 instead of the bit line 127 as described in the first embodiment.

In some cases, prior to accessing the next bit, it may be necessary to perform the operation of writing the data waiting in the other register back into the original magnetic unit 101 including the accessed bit while moving the magnetic domains of the magnetic unit 101 including the accessed bit in the reverse direction.

Thus, the shift register memory of the embodiment can nonvolatilely record large-capacity information in the three-dimensionally arranged magnetic units by moving the domain walls and performing recording/reproducing.

Third Embodiment

A magnetic memory 20 according to the embodiment will now be described using FIG. 5.

Figure 5:
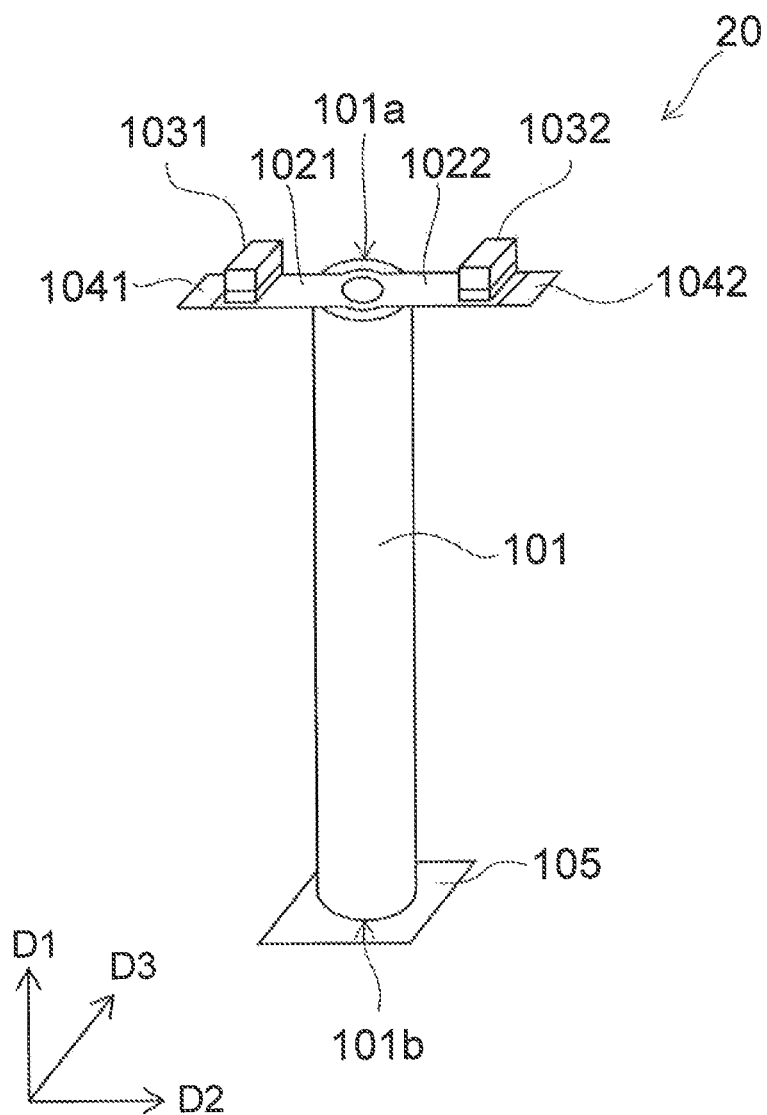
FIG. 5 is a perspective view of the magnetic memory according to the third embodiment.

FIG. 5 is a perspective view of the magnetic memory according to the third embodiment.

Compared to the magnetic memory according to the first embodiment and the second embodiment, the magnetic memory 20 according to the embodiment differs in that multiple magnetic layers are connected to the magnetic unit.

As shown in FIG. 5, the magnetic memory 20 includes the magnetic unit 101; and multiple magnetic layers 1021 and 1022 are connected to the first end portion 101$a$ of the magnetic unit 101. A first recording/reproducing element 1031 is provided on the first magnetic layer 1021. A second recording/reproducing element 1032 is provided on the second magnetic layer 1022. When simultaneously moving the magnetic domains of the magnetic layers 1021 and 1022 into the magnetic unit 101, the magnetic domains can be stabilized further when moving the magnetic domains into the magnetic unit 101 if the orientations of the magnetic domains of the magnetic layers 1021 and 1022 are aligned in a prescribed relationship. Also, it is possible to move the magnetic domains into the magnetic unit 101 more accurately, more quickly, and with a smaller shift current. When writing the information to the magnetic unit 101, the current for shifting the magnetic domains is caused to flow simultaneously from the electrode 105 (a second electrode) into an electrode 1041 (the first electrode) and from the electrode 105 into an electrode 1042 (the third electrode).

The magnetic layers 1021 and 1022 are made by forming a magnetic film in contact with the magnetic unit 101 and subsequently patterning the magnetic film using a lithography process. Although it is desirable for the magnetic layers 1021 and 1022 to be separated from each other, portions of the magnetic layers 1021 and 1022 may be connected to each other if mutually-independent magnetic domains are maintainable.

Fourth Embodiment

A magnetic memory 30 according to the embodiment will now be described using FIG. 6.

Figure 6:
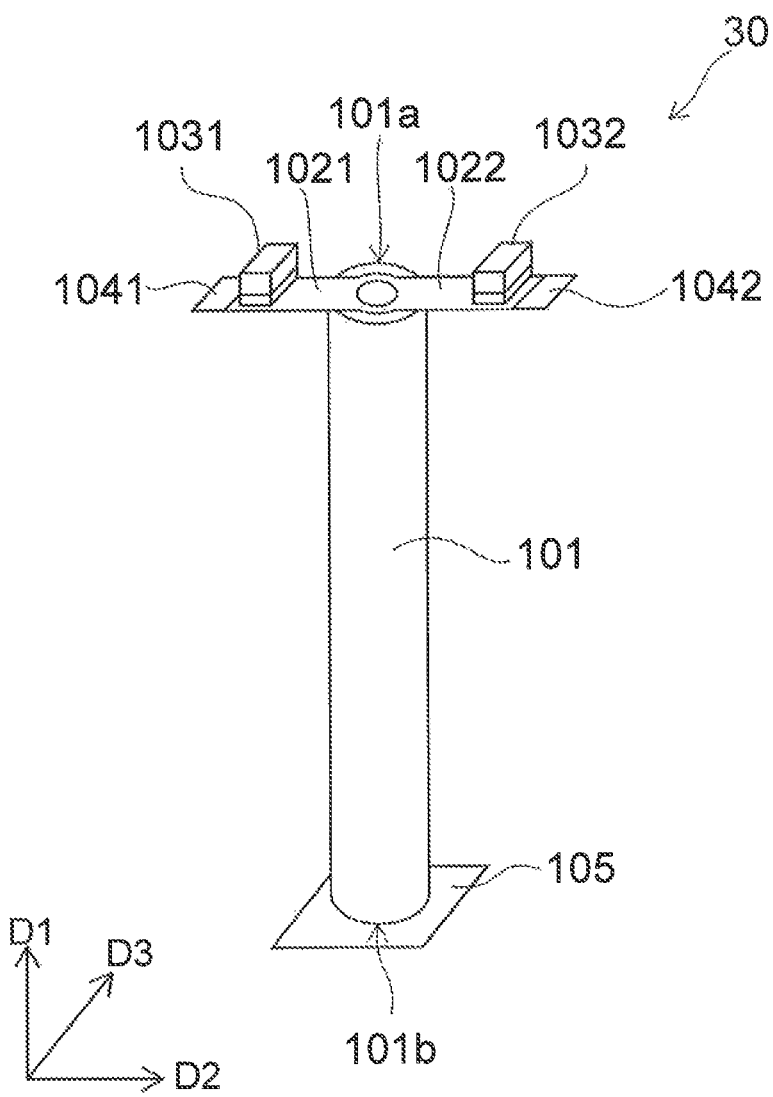
FIG. 6 is a perspective view of the magnetic memory according to the fourth embodiment.

FIG. 6 is a perspective view of the magnetic memory according to the fourth embodiment.

As shown in FIG. 6, the magnetic memory 30 includes the magnetic unit 101; and the two magnetic layers 1021 and 1022 are connected to the first end portion 101a of the magnetic unit 101. A dedicated recording element 1031 is provided on the first magnetic layer 1021; and a dedicated reproducing element 1032 is provided on the second magnetic layer 1022. The electrode 1041 (the first electrode) is connected to the first magnetic layer 1021. The electrode 1042 (the third electrode) is connected to the second magnetic layer 1022. The electrode 105 (the second electrode) is connected to the second end portion 101b of the magnetic unit 101 on the side opposite to the side where the magnetic layer 102 is provided.

When writing the information to the magnetic unit 101, the information is written to the first magnetic layer 1021 while causing the shift current to flow from the electrode 105 toward the electrode 1041. When reproducing the information of the magnetic unit 101, the shift current is caused to flow from the electrode 1042 toward the electrode 105; the magnetic domain of the target address position is moved into the second magnetic layer 1022; and the magnetic domain of the target address position is reproduced.

The shift current when writing the information to the magnetic unit 101 may be caused to flow only from the electrode 105 toward the electrode 1041 or may be caused to flow simultaneously from the electrode 105 toward the electrode 1041 and the electrode 1042.

Similarly, the shift current when reproducing the information of the magnetic unit 101 may be caused to flow only from the electrode 1042 toward the electrode 105 or may be caused to flow simultaneously from the electrode 1041 and the electrode 1042 toward the electrode 105.

The magnetic layers 1021 and 1022 are made by forming a magnetic film in contact with the magnetic unit 101 and subsequently patterning the magnetic film using a lithography process. Although it is desirable for the magnetic layers 1021 and 1022 to be separated from each other, portions of the magnetic layers 1021 and 1022 may be connected to each other if mutually-independent magnetic domains are maintainable.

By separating the recording device and the reproducing element as in the embodiment, it is easy to increase the precision of the recording/reproducing and perform the recording/reproducing using elements other than the MTJ element such as, for example, a GMR (Giant Magneto Resistive effect) element, a Hall element using the anomalous Hall effect, etc.

In the magnetic unit 101 of the embodiments described above, the dimension in the second direction of the magnetic unit 101 is constant from one end portion to the other end portion. However, it is desirable for the magnetic unit 101 to include (narrow) portions having a small dimension in the second direction, i.e., portions having a small cross-sectional area of the column or a short outer circumference of the column, that are provided periodically in the first direction.

Because the outer circumference is short at the portions having the small dimension (diameter) of the magnetic unit 101 having the columnar configuration, the domain wall can exist at the portions having the small dimension (diameter) at an energy lower than that of portions having the long outer circumference. Therefore, even in the case where there is fluctuation in the shift amount of the domain walls, the domain walls stably stop at the portions having the small dimension.

By the magnetic unit 101 including, periodically in the first direction, portions where the dimension in the second direction is a second value between portions where the dimension is a first value such that the second value is smaller than the first value, the domain walls can exist stably at the portions where the dimension is the second value. By the domain walls existing stably at the portions of the magnetic unit 101 where the dimension is small, the regions that retain the magnetic domains also are stable; and therefore, operation errors due to shift error of the domain walls can be suppressed.

The method for making the magnetic unit 101 in which the portions having the small dimension in the second direction are provided periodically will now be described using FIGS. 7A to 7D.

FIGS. 7A to 7D are cross-sectional views of processes, showing manufacturing processes of the magnetic unit 101.

First, for example, the substrate 401 of aluminum is prepared as a base member (FIG. 7A).

Then, anodic oxidation of the substrate 401 is performed to make the oxide (the alumina) 402 in which an arrangement of holes is made (FIG. 7B).

In the case where the substrate 401 is aluminum, one of sulfuric acid, oxalic acid, or phosphoric acid or a mixture of these acids may be used as the electrolyte fluid. In particular, sulfuric acid is desirable as the electrolyte fluid because it is possible to make the pitch of the holes narrower, and it is possible to perform the processing at a low voltage that has little effect on the transistors. The value of the pitch of the holes is substantially determined by the type of the electrolyte fluid and the formation positions of the reaction starting points. The value of the diameter of the hole is substantially determined by the voltage applied to the substrate 401 in the anodic oxidation. The value of the length of the hole is substantially determined by the processing time of the anodic oxidation. For example, in the case where anodic oxidation in which 0.3 mol/L of sulfuric acid is used as the electrolyte fluid is performed at 35° C. with a voltage (a first voltage value) of 25 V applied for 225 minutes, an arrangement of holes is made in which the diameter of the hole is 30 nm and the length of the hole is 15 μm.

Here, by periodically applying a voltage (a second voltage value) of about 30 V which is higher than 25 V, the portions having the small dimension in the second direction are formed because the anodic oxidation progresses quickly in the depth direction while the high voltage is applied (a low temperature is desirable at this time). That is, a hole that has a periodically pinched-in structure is made by periodically introducing the voltage of about 30 V because the dimension in the second direction becomes small at the portions where the voltage of about 30 V is applied.

As an example, a pinched-in portion can be made at a pitch of about 30 nm corresponding to the length of the magnetic domain of one bit by introducing a voltage pulse of 30 V for 0.1 seconds at a period of 24 seconds in the anodic oxidation when applying the voltage of 25 V to the substrate 401.

Because the application of the high voltage obstructs straight-line hole growth, it is desirable for the time of the application of the voltage of the second voltage value to be 2 seconds or less.

Subsequently, the barrier layer 403 existing at the bottom portions of the holes and the unreacted substrate 401a are dissolved and peeled; and the membrane 404 having an arrangement of holes is formed (FIG. 7C).

The magnetic unit 101 that includes the periodic portions having the small diameter is obtained by sequentially forming the foundation layer 107 and the magnetic unit 101 as films in the interior of the holes of the membrane 404 by CVD (FIG. 7D).

The magnetic unit 101 in which the portions having the small dimension in the second direction are formed periodically may be made by dry etching. Mainly, the following two methods are used for the dry etching.

In the first method, first, the base member for making the holes is formed by alternately stacking two (or more) types of films having different etching rates. Then, by performing dry etching of the stacked films, holes are made in which the dimension in the second direction changes periodically according to the difference of the etching rates.

The second method is a Bosch process in which holes are made in the base member by dry etching and the excavating progresses further while protecting the inner walls of the holes with the redeposition (the etching debris) produced in the dry etching. In the Bosch process, the dry etching is performed by alternately using a first gas (e.g., $C_4F_8$) that etches while protecting the sidewalls by the redeposition, and a second gas (e.g., $SF_6$) that etches while removing the redeposition. At this time, the anisotropy of the etching rate for the base member is different between the first gas and the second gas. Therefore, the dimension in the second direction of the holes is different between the portion etched by the first gas and the portion etched by the second gas. At this time, the holes that include the portions having the small dimension in the second direction are made periodically by adjusting the etching time and rate of the first gas and the second gas.

Fifth Embodiment

A magnetic memory 40 according to the embodiment will now be described using FIGS. 8 and 9.

FIG. 8 is a perspective view of the magnetic memory according to the fourth embodiment.

FIGS. 9A and 9B show manufacturing processes of the magnetic memory according to the fourth embodiment.

As shown in FIG. 8, the magnetic memory 40 includes the magnetic unit 101 having a polygonal cross section. By setting the cross section of the magnetic unit 101 to be a polygon, it is possible to write the magnetic domains independently to each of the wall surfaces. This structure utilizes the characteristic that it is difficult for the domain walls to move through a bend; and the magnetic domains that are written to one surface cannot move through the bend to the adjacent surface and move only in the one surface.

For example, in the case where the magnetic unit is made by making such a polygonal hole using the anodic oxidation described in regard to the method for manufacturing the magnetic memory according to the first embodiment, it is desirable for the cross section of the magnetic unit to be a triangle, a quadrilateral, or a hexagon to grow the multiple holes to be arranged with high density.

Here, a quadrilateral tube magnetic unit 101 of which the cross section is a quadrilateral will be described.

The magnetic unit 101 has easy magnetization axes that are directions perpendicular to the wall surfaces extending in the first direction. The magnetic unit 101 is formed on a not-shown foundation layer. The magnetic unit 101 includes perpendicular magnetization layers 101A, 101B, 101C, and 101D. Of these perpendicular magnetization layers, the case is described where the perpendicular magnetization layers 101A and 101B are used to record the information. For the description of FIG. 8, the perpendicular magnetization layer 101D that is positioned frontward of the perpendicular magnetization layers 101A and 101B is not shown. The perpendicular magnetization layer 101A is connected to the magnetic layer 1021; and the perpendicular magnetization layer 101B is connected to the magnetic layer 1022. The recording/reproducing element 1031 is provided on the magnetic layer 1021. The magnetic layer 1021 is connected to the electrode 1041. The recording/reproducing element 1032 is provided on the magnetic layer 1022. The magnetic layer 1022 is connected to the electrode 1042. The electrode 105 is connected to the lower end of the quadrilateral prism magnetic unit 101. Here, although the case is described where the magnetic layers that are included in the magnetic unit 101 are perpendicular magnetization layers and each of the magnetic layers connected to the magnetic unit 101 are inner-plane magnetization layers, the magnetic layers of the sidewalls of the magnetic unit 101 may be inner-plane magnetization layers; and each of the magnetic layers connected to the magnetic unit 101 may be perpendicular magnetization layers or inner-plane magnetization layers.

The magnetic domains are written to the magnetic layer 1021 by the recording/reproducing element 1031; and the magnetic domains that are recorded are moved into the perpendicular magnetization layer 101A by causing a current to flow between the electrode 1041 and the electrode 105. At this time, for example, the effects of the magnetic domains recorded in the perpendicular magnetization layer 101A on the magnetic domains recorded in the other perpendicular magnetization layers 101B, 101C, and 101D are small because the perpendicular magnetization layers 101A to 101D included in the magnetic unit 101 are magnetically independent from each other. Therefore, for the magnetic unit having the columnar configuration, it is possible to store the information in a maximum of four surfaces. In the embodiment, the case is illustrated where two of the surfaces (the perpendicular magnetization layers 101A and 101B) are used.

Because the perpendicular magnetization layers are electrically connected to each other, it is desirable for the movement of the domain walls to be performed simultaneously for the perpendicular magnetization layers. Accordingly, the operation of writing the magnetic domain to the magnetic layer 1022 by the recording/reproducing element 1032 and moving the magnetic domain that is recorded into the perpendicular magnetization layer 101B by causing the current to flow between the electrodes 1042 and 105 is performed simultaneously with writing the magnetic domain to the magnetic layer 1021 by the recording/reproducing element 1031 and moving the magnetic domain that is recorded into the perpendicular magnetization layer 101A by causing the current to flow between the electrodes 1041 and 105. This is similar for reproducing the information recorded in each of the perpendicular magnetization layers. The magnetic domains of the perpendicular magnetization layers 101A and 101B are moved respectively toward the magnetic layers 1021 and 1022 by causing the current to flow in the reverse direction of the writing between the electrodes 1041 and 105 and between the electrodes 1042 and 105; and the magnetization directions of the magnetic domains are reproduced respectively for the recording/reproducing elements 1031 and 1032.

Here, although the case is described where two surfaces of the magnetic unit 101, i.e., the perpendicular magnetization layers 101A and 101B, are used, it is possible to use all of the surfaces of the perpendicular magnetization layers 101A to 101D by providing magnetic layers, recording/reproducing elements, and electrodes corresponding to each of the perpendicular magnetization layers 101A to 101D.

An example of a method for making the quadrilateral tube magnetic unit 101 having the quadrilateral cross section using anodic oxidation is shown in FIGS. 9A and 9B.

First, reaction starting points 803 such as, for example, scratches, etc., are made by pressing a nanoimprint mold 802 onto the front surface of the substrate 401 at high pressure (FIG. 9A). Other than nanoimprinting, the scratches that are used as the reaction starting points may be made by mask patterning using electron beam lithography, etc., and etching. The reaction starting points 803 are made in a lattice configuration.

Oxidation reaction from each of the reaction starting points 803 starts when anodic oxidation of the substrate 401 is performed. At this time, in the inner-plane direction, the anodic oxidation reaction (the growth of the alumina and the holes) stops at the intermediate points between the reaction starting points 803 most proximal to each other. As a result, as shown in FIG. 9B, the cross sections of the holes become quadrilateral. Because the anodic oxidation reaction progresses in the perpendicular direction while maintaining the cross sections, the holes become quadrilateral prisms. Thus, an arrangement of quadrilateral prism holes is made by the anodic oxidation. The quadrilateral prism magnetic units 101 are completed by performing film formation on the inner walls of the quadrilateral prism holes. The manufacturing method is merely an example; and other methods such as dry etching, etc., may be used.

According to the embodiment, the magnetic memory can be configured by using the multiple wall surfaces of the magnetic unit having the quadrilateral cross section as independent recording regions. Other than the quadrilateral described above, the cross-sectional configuration of the magnetic unit 101 may be a triangle, a hexagon, or an ellipse having sufficiently high flattening.

Sixth Embodiment

A magnetic memory 50 according to the embodiment will now be described using FIG. 10.

Figure 10:
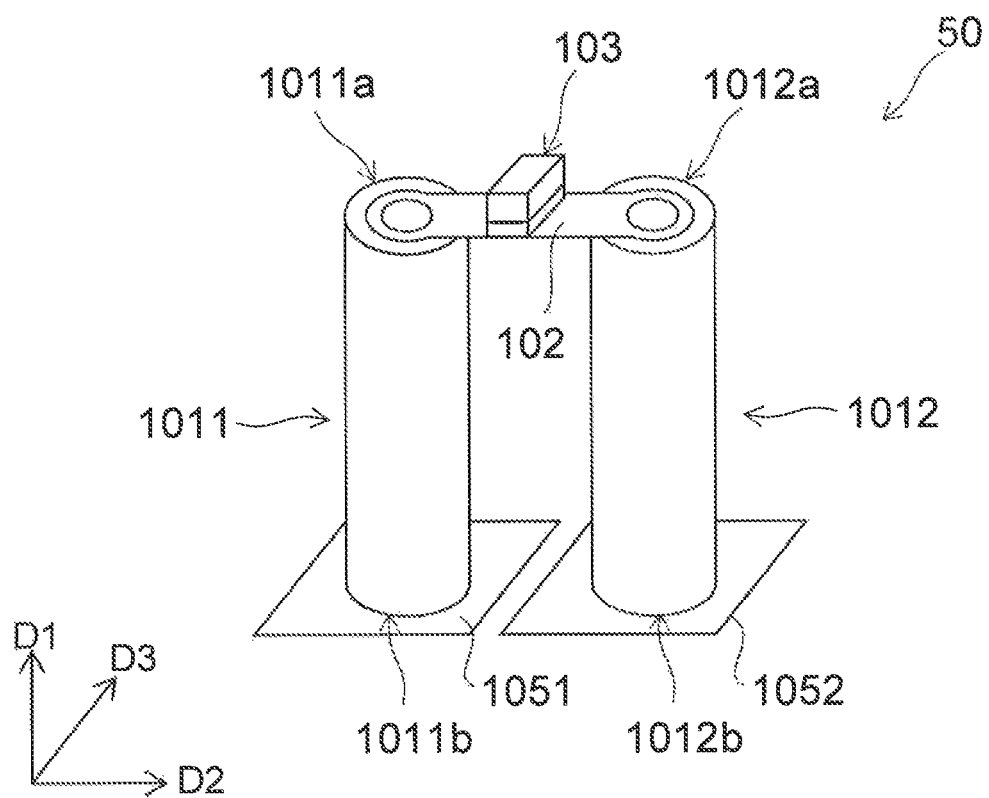
FIG. 10 is a perspective view of the magnetic memory according to the sixth embodiment.

FIG. 10 is a perspective view of the magnetic memory according to the sixth embodiment.

As shown in FIG. 10, the magnetic memory 50 has a structure in which two columnar configurations of the magnetic units are connected by a magnetic layer. Therefore, compared to the magnetic memory of the first embodiment, the structure is more suited to a shift register memory. The magnetic memory 50 includes a magnetic unit 1011 and a magnetic unit 1012. A first end portion 1011a of the magnetic unit 1011 and a first end portion 1012a of the magnetic unit 1012 are connected by the magnetic layer 102. An electrode (the first electrode) 1051 is connected to a second end portion 1011b of the magnetic unit: 1011 on the side opposite to the side connected to the magnetic layer 102. An electrode (the second electrode) 1052 is connected to a second end portion 1012b of the magnetic unit 1012 on the side opposite to the side connected to the magnetic layer 102.

For example, by causing the current to flow between the electrode 1051 and the electrode 1052 from the electrode 1052 toward the electrode 1051, the magnetic domains of the magnetic unit 1011 move into the magnetic layer 102; and simultaneously, the magnetic domains of the magnetic layer 102 move into the magnetic unit 1012. By changing the direction of the current, the magnetic domains can be moved back and forth between the two magnetic units 1011 and 1012 via the magnetic layer 102.

After moving the target magnetic domain into the magnetic layer 102, the recording/reproducing element 103 of the magnetic layer 102 reproduces the information by sensing the magnetization direction of the magnetic domain of the magnetic layer 102 or records the information by forming the magnetic domain in the magnetic layer 102.

Although a form in which two magnetic units are connected is shown in FIG. 10, many more magnetic units may be connected. In such a case, it is unnecessary to provide recording/reproducing elements on all of the magnetic layers provided between the magnetic units.

By providing the magnetic memory 50 according to the embodiment to be multiply arranged, a shift register memory can be configured in which the multiple magnetic units are connected via the magnetic layer unit that performs the recording/reproducing.

Seventh Embodiment

A magnetic memory 60 according to the embodiment will now be described using FIGS. 11A and 11B.

Figure 11A:
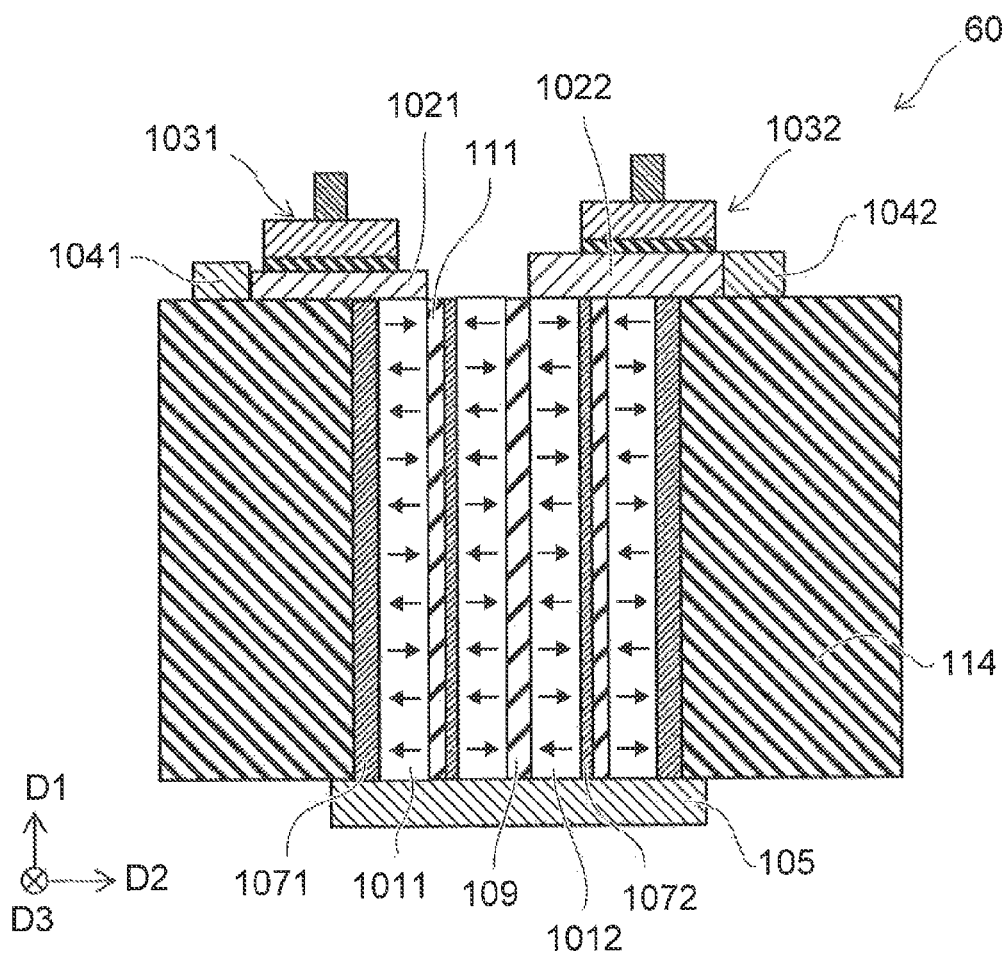
FIG. 11A is a cross-sectional view of the magnetic memory according to the seventh embodiment and FIG. 11B is a plan view of the magnetic memory according to the seventh embodiment.
Figure 11B:
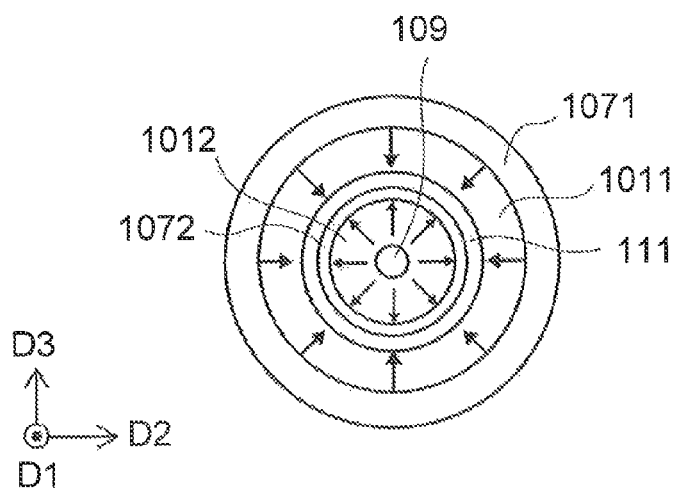

FIG. 11A is a cross-sectional view of the magnetic memory according to the seventh embodiment; and FIG. 11B is a plan view.

As shown in FIGS. 11A and 11B, the magnetic memory 60 includes multiple magnetic units formed coaxially. A magnetic memory having higher density can be made by providing the multiple magnetic units coaxially.

As shown in FIG. 11A, the magnetic memory 60 includes the first magnetic unit 1011 and the second magnetic unit 1012. The first magnetic unit 1011 is formed on a first foundation layer 1071. The second magnetic unit 1012 is formed on a second foundation layer 1072.

The first magnetic unit 1011 and the second magnetic unit 1012 are insulated from each other by an insulating layer 111. The nonmagnet 109 is provided at the center of the second magnetic unit 1012.

The first magnetic unit 1011 is connected to the first magnetic layer 1021 provided on an insulator 114. The second magnetic unit 1012 is connected to the second magnetic layer 1022 provided on the insulator 114. The first magnetic layer 1021 and the second magnetic layer 1022 are provided to be capable of maintaining mutually-independent magnetic domains. The first recording/reproducing element 1031 is provided on the first magnetic layer 1021; and the second recording/reproducing element 1032 is provided on the second magnetic layer 1022. The first magnetic layer 1021 is electrically connected to the first electrode 1041. The second electrode 1042 is electrically connected to the second magnetic layer 1022. The first electrode 1041 is provided so that the portion of the magnetic layer 1021 contacting the recording/reproducing element 1031 is positioned in the current path between the first electrode 1041 and the magnetic unit 1011. The second electrode 1042 is provided so that the portion of the magnetic layer 1022 contacting the recording/reproducing element 1032 is positioned in the current path between the second electrode 1042 and the magnetic unit 1012. The end portions of the first magnetic unit 1011 and the second magnetic unit 1012 on the sides not connected to the first magnetic layer 1021 or the second magnetic layer 1022 are connected to the third electrode 105.

Separate magnetic domains, i.e., information, are recordable independently in the first magnetic unit 1011 and the second magnetic unit 1012. In the embodiment, the shift operation of the domain walls for each of the magnetic units is simultaneous because the electrode 105 is common to the first magnetic unit 1011 and the second magnetic unit 1012. However, instead of the electrode 105, the shift operation can be independent for each of the magnetic units by separately providing electrodes for the first magnetic unit 1011 and the second magnetic unit 1012.

It is favorable for the first magnetic layer 1021 and the second magnetic layer 1022 to be provided on the same side of the first magnetic unit 1011 and the second magnetic unit 1012 to easily make the first magnetic layer 1021 and the second magnetic layer 1022.

An example of a method for making the magnetic memory 60 will now be described.

First, the hole is made by anodic oxidation, etc.

Then, the first foundation layer 1071, the first magnetic unit 1011, the insulating layer 111, the second foundation layer 1072, and the second magnetic unit 1012 are formed in this order as films on the inner wall of the hole; and finally, the nonmagnet 109 is formed by filling a nonmagnet into the hollow portion of the second magnetic unit 1012.

Thus, the easy magnetization axes of the magnetic units can be controlled to be in the diametrical direction by the foundation layers. Therefore, the two magnetic units 1011 and 1012 can be made to have perpendicular magnetization and the same central axis.

Although the central axes of the two magnetic units may not match, it is favorable for the central axes of the two magnetic units to match to provide the magnetic units at a higher density. Dry etching, etc., may be used instead of anodic oxidation as the method for making the holes for forming the magnetic units. Or, the magnetic memory 60 may be made by forming a pillar of a nonmagnet and forming the second foundation layer 1072, the second magnetic unit 1012, the insulating layer 111, the first foundation layer 1071, and the first magnetic unit 1011 as films in this order.

According to the embodiment, many magnetic units can be made even when using an arrangement of low density holes or an arrangement of low density pillars because the multiple magnetic units can be made using one hole or pillar.

According to the embodiment, a large memory capacity can be achieved even when using the arrangement of low density holes because the recording/reproducing of mutually-independent information in multiple magnetic units having the same central axis is possible.

Eighth Embodiment

A shift register memory according to the embodiment will now be described using FIG. 12.

Figure 12:
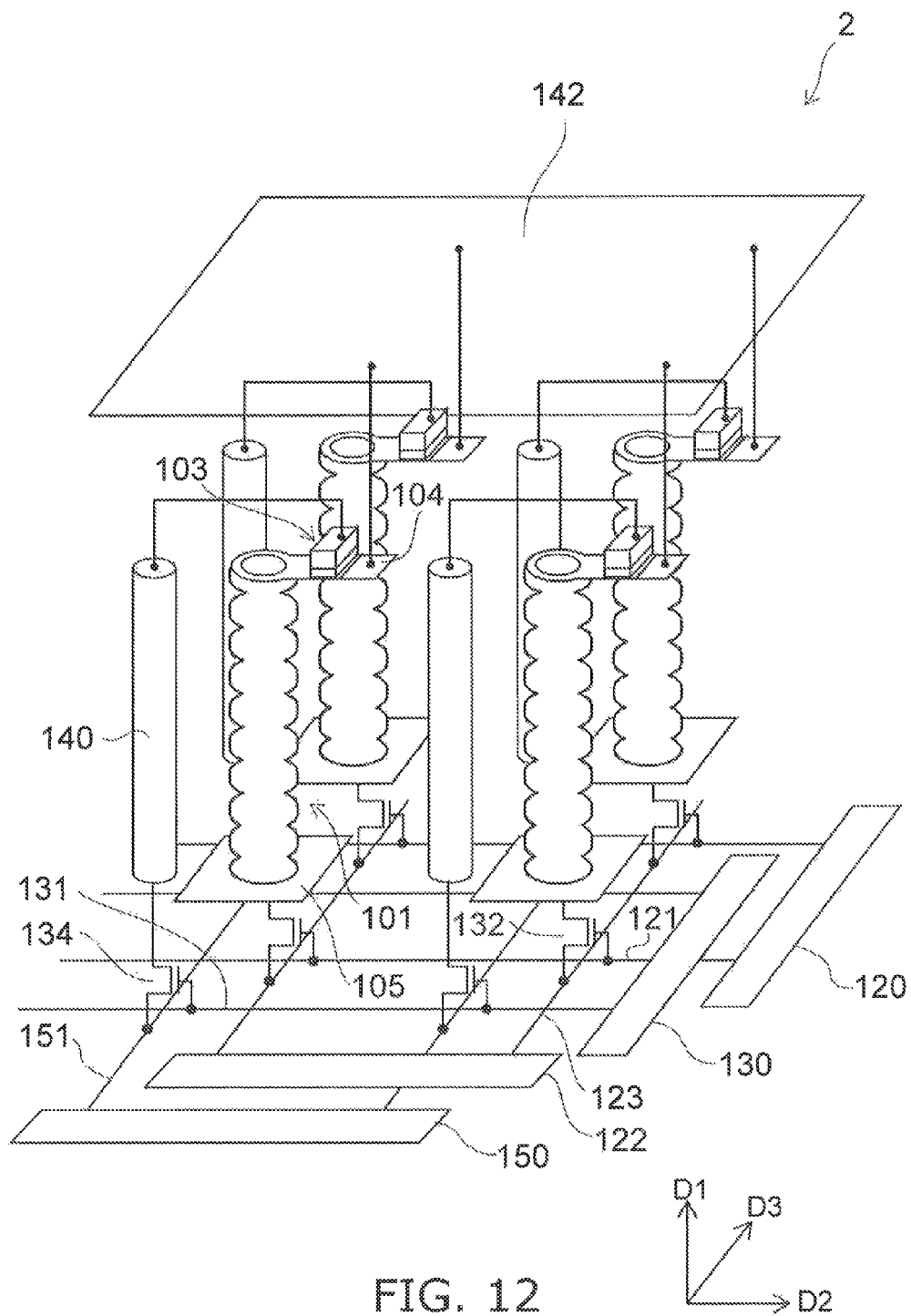
FIG. 12 is a schematic view of the shift register memory 2 according to the eighth embodiment.

FIG. 12 is a schematic view of the shift register memory 2 according to the eighth embodiment.

As shown in FIG. 12, the shift register memory 2 is a three-dimensional memory in which, as one unit, the magnetic unit 101, the magnetic layer 102 connected to the magnetic unit 101, the recording/reproducing element 103, the first electrode 104, and the second electrode 105 that are included in the magnetic memory 10 according to the first embodiment are arranged in an array configuration in the row direction and the column direction.

Although the magnetic memory 10 is provided to be multiply arranged in the row direction and the column direction in the embodiment, the magnetic memory 10 may be provided in only one column in the row direction or the column direction.

The row direction is, for example, the direction D2 shown in FIG. 12. The column direction is, for example, the direction D3 shown in FIG. 12.

In the shift register memory 1 according to the second embodiment shown in FIG. 4, the transistors are provided both above and below the magnetic unit 101.

Conversely, in the embodiment as shown in FIG. 12, a configuration is used in which the transistors are provided together below the magnetic unit 101. The transistors that are used in the embodiment can be largely divided into the two types of the transistors for selecting the magnetic units (the first transistors) and the transistors for selecting the recording/reproducing elements (the second transistors).

In the shift register memory 2, first, the two types of transistors are provided on a substrate. The multiple magnetic units 101 are provided on the substrate of the transistors; or a substrate in which the multiple magnetic units 101 are formed is bonded to the substrate of the transistors. The magnetic layer 102 is connected to the upper end portion of the magnetic unit 101; and the electrode 104 is connected to the magnetic layer 102. The recording/reproducing element (e.g., the MTJ element) 103 is provided on the magnetic layer 102. An interconnect 140 is connected to the side of the recording/reproducing element 103 opposite to the side where the magnetic layer 102 is provided. The interconnect 140 is connected to the transistor provided on the lower side of the magnetic unit 101. The electrode 105 is connected to the lower end portion of the magnetic unit 101.

The shift register memory 2 includes the first common gate line selector 120, the lower electrode selector 122, the second common gate line selector 130, and a recording/reproducing element selector 150.

The first common gate line selector 120 is connected to the multiple first common gate lines 121 extending in the second direction. The lower electrode selector 122 is connected to the multiple first common interconnects 123 extending in the third direction. The second common gate line selector 130 is connected to the multiple second common gate lines 131 extending in the second direction. The recording/reproducing element selector 150 is connected to multiple second common interconnects 151 extending in the third direction.

The shift register memory 2 includes the multiple first transistors 132 and the multiple second transistors 134.

The gate of the first transistor 132 is connected to the first common gate line 121. One of the terminals of the first transistor 132 other than the gate is connected to the first common interconnect 123; and the other is connected to the corresponding second electrode 105.

The gate of the second transistor 134 is connected to the second common gate line 131. One of the terminals of the second transistor 134 other than the gate is connected to the recording/reproducing element 103 via the corresponding interconnect 140; and the other is connected to the second common interconnect 151. The terminal of the second transistor 134 that is connected to the corresponding recording/reproducing element 103 is connected to the side opposite to the side where the magnetic layer 102 is provided.

The first transistor 132 and the second transistor 134 are provided together on the side of the magnetic unit 101 where the second electrode 105 is provided. Therefore, it is necessary for the interconnect 140 connected to the recording/reproducing element 103 to extend to the lower side of the magnetic unit 101. In the embodiment, a portion of the member having the columnar configuration is used as the interconnect 140. Specifically, instead of forming a magnet in the interior of the portion of the member having the columnar configuration, for example, a conductor such as copper, tungsten, etc., is formed in the interior; and the conductor having the columnar configuration is used as the interconnect 140.

A common electrode 142 is provided above the magnetic unit 101. When driving the recording/reproducing element 103 in the embodiment, the writing and the reproducing are performed by causing the current to flow between the interconnect 140 connected to the recording/reproducing element 103 and the first electrode 104 provided at the end portion of the magnetic layer 102 without using the word line and the bit line as in the second embodiment. Thereby, it is easy to provide the first transistor 132 and the second transistor 134 together on one side of the magnetic unit 101.

The operation of moving the magnetic domains of the magnetic unit 101 in the shift register memory 2 according to the embodiment will now be described.

The second electrode 105 that is connected to the magnetic unit 101 of the target address position is selected by the first common gate line selector 120 selecting the prescribed first common gate line 121 and the lower electrode selector 122 selecting the prescribed first common interconnect 123. The first electrode 104 is connected to the common electrode 142 which has the fixed potential; and the shift current for moving the domain walls flows between the first electrode 104 and the selected second electrode 105. The shift operation of the domain walls is performed while reproducing the magnetization directions of the magnetic domains one bit at a time until the magnetic domain of the target address position comes to the position of the magnetic layer 102 contacting the recording/reproducing element 103. The bits that are reproduced wait temporarily in a not-shown register or are recorded in another magnetic unit 101. This method is used because the shift register memory 2 according to the embodiment performs destructive read-out (as the magnetic domains move in the reproducing element direction, the magnetic domain information at the end is lost).

When writing the information, the domain walls of the selected magnetic unit 101 are moved using the first common gate line selector 120 and the lower electrode selector 122 so that the magnetic domain of the target address position moves to the position of the magnetic layer 102 contacting the recording/reproducing element 103. After the magnetic domain of the target address position is moved to the position of the magnetic layer 102, the recording/reproducing element 103 of the multiple recording/reproducing elements 103 that contacts the magnetic layer 102 to which the information is to be written is selected by the second common gate line selector 130 selecting the prescribed second common gate line 131 and the recording/reproducing element selector 150 selecting the prescribed second common interconnect 151. The first electrode 104 is connected to the common electrode 142; and a current flows between the first electrode 104 and the selected recording/reproducing element 103. At this time, a current flows in the second common interconnect 151 in the direction corresponding to the information (0/1) to be recorded. The magnetic domain of the prescribed magnetization direction is formed in the magnetic layer 102 according to the direction of the current flowing in the second common interconnect 151; and the information is recorded.

When reproducing the information, the domain walls of the selected magnetic unit 101 are moved using the first common gate line selector 120 and the lower electrode selector 122 so that the magnetic domain of the target address position moves to the position of the magnetic layer 102 contacting the recording/reproducing element 103. After the magnetic domain of the target address position is moved to the position of the magnetic layer 102, the recording/reproducing element 103 of the multiple recording/reproducing elements 103 contacting the magnetic layer 102 from which the information is to be reproduced is selected by the second common gate line selector 130 selecting the prescribed second common gate line 131 and the recording/reproducing element selector 150 selecting the prescribed second common interconnect 151. At this time, the current that flows in the second common interconnect 151 changes according to whether or not the magnetization direction of the pinned layer 103b of the recording/reproducing element 103 and the magnetization direction of the magnetic domain of the magnetic layer 102 are the same direction. Thereby, it is possible to sense the magnetization direction of the recorded magnetic domain and reproduce the information (0/1).

It is desirable for the magnetic layer 102 and the recording/reproducing element 103 that are connected to the magnetic unit 101 to be formed on the side of the magnetic unit 101 opposite to the side where the first transistor 132 and the second transistor 134 are provided. Also, it is desirable for the magnetic layer 102 and the recording/reproducing element 103 to be formed after forming the magnetic unit 101. This is because, compared to the case where the magnetic unit 101 is formed on the magnetic layer 102 and the recording/reproducing element 103, for example, the damage to the magnetic layer 102 and the recording/reproducing element 103 in the piercing processing can be reduced; and the magnetic junction between the magnetic unit 101 and the magnetic layer 102 is easy.

An example of a method for manufacturing the shift register memory 2 according to the eighth embodiment will now be described using FIGS. 13A to 13E.

First, a transistor 502 and an electrode 503 are formed on a substrate 500 of silicon.

An aluminum layer 508 is formed or adhered on the substrate 500 as the base member on which the anodic oxidation is performed. In such a case, it is desirable for the purity of the aluminum to be high (favorably 99.99% or more) to avoid defects. A sacrificial layer 510 may be provided between the substrate 500 and the aluminum layer 508 for removing an insulating layer 504 that protects the transistor 502 from the voltage of the anodic oxidation and for removing the barrier layer that remains at the end of the anodic oxidation. For example, it is desirable to perform cleaning using hydrochloric acid, nitric acid, hydrofluoric acid, a mixed acid of these acids, an organic solvent, etc., and polishing of the front surface of the aluminum layer 508.

Figures 13A, 13B:
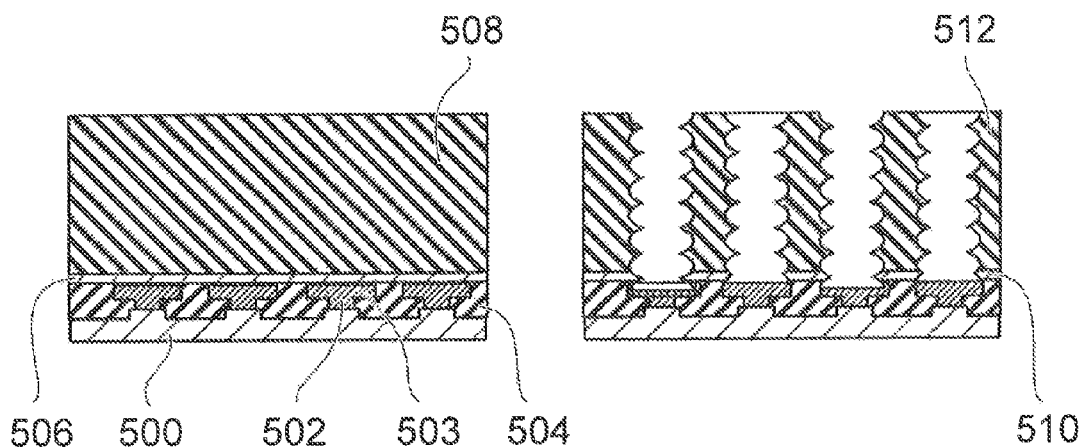
FIGS. 13A to 13E are cross-sectional views of processes, showing manufacturing processes of the shift register memory according to the eighth embodiment.

An arrangement of holes is made in the aluminum layer 508 by anodic oxidation (FIG. 13B). At this time, the arrangement precision of the holes may be increased by making reaction starting points, e.g., scratches having depths on the order of several nm, by imprinting, dry etching using a mask, etc.

Although the holes in FIGS. 13A to 13E are made so that the diameter is caused to change periodically in the first direction by controlling the voltage of the anodic oxidation as described in regard to FIGS. 7A to 7D, holes may be made in which the diameter does not change in the first direction.

In the anodic oxidation, a region called the barrier layer remains at the hole bottoms; and there are cases where the holes do not pierce the base member. In such a case, processing is performed to remove the barrier layer so that the holes pierce through to the electrode provided at the lower portion of the aluminum layer 508. In the case where aluminum is used as the base member, the barrier layer is alumina and therefore is removable by a strong acid; but it is difficult to selectively remove only the barrier layer at the bottom portions of the high-aspect holes made in the alumina. Also, there are cases where the diameters of the holes are undesirably made substantially larger by the strong acid etching. Therefore, it is favorable to provide the sacrificial layer 510 beforehand between the aluminum layer 508 and the insulating layer 504 on the transistor 502. In the case where the sacrificial layer 510 includes, for example, tungsten, the tungsten is modified by an oxidation reaction at the final stage of the anodic oxidation; and the modified portion can be removed more easily than alumina by the strong acid, etc. Therefore, the increase of the diameters of the holes when performing the piercing processing can be suppressed. Also, the sacrificial layer 510 may include silicon; and in such a case, the portion that becomes silicon oxide in the anodic oxidation is removed by hydrofluoric acid, etc. In the case where the sacrificial layer 510 includes silicon, the sacrificial layer 510 also can be used as the insulating layer 504 for protecting the transistors.

In the method for making the arrangement of holes illustrated in the embodiment, the base member includes aluminum; and anodic oxidation is performed. However, instead, the arrangement of holes may be made by anodic oxidation using hydrofluoric acid for a silicon layer or dry etching such as a Bosch process, etc., for a silicon layer.

Figures 13C, 13D:
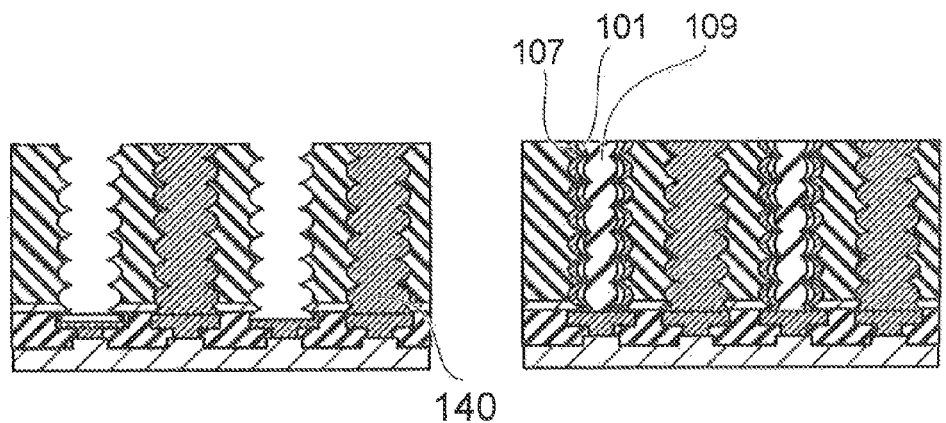

Then, the interconnect 140 is formed by filling a conductor into some of the holes (FIG. 13C). For example, copper and/or tungsten may be used as the filling material. Plating or CVD may be used as the filling method. The film formation may be selectively performed in the target holes by selectively forming a mask on the upper portion of the holes to select the holes to be filled and by using the electrode provided on the substrate 500 to perform electroplating.

The foundation layer 107 and the magnetic unit 101 are formed as films by CVD in the remaining holes. The magnetic unit 101 includes, for example, a multilayered film of cobalt, nickel, etc. To increase the recording density, it is desirable for the magnetic unit 101 to have perpendicular magnetization in which the easy magnetization axis is the direction from the wall surface toward the hollow portion. Other than cobalt and nickel, it is also possible to use an alloy selected from iron, cobalt, platinum, and rare-earth elements as the material of the magnetic unit 101.

Subsequently, the insulative nonmagnet 109 (e.g., silicon oxide) is filled into the center of the magnetic unit 101 (FIG. 13D).

Figure 13E:
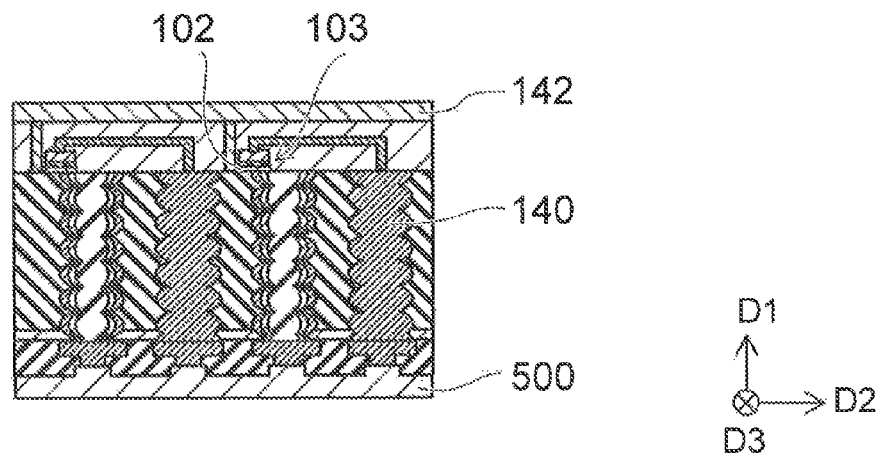

Then, the front surface is planarized by CMP polishing, etching, etc. The magnetic layer 102 that is connected to the magnetic unit 101 is formed on the front surface; and the recording/reproducing element 103 is formed on the magnetic layer 102. Then, the common electrode 142 and the interconnect connecting the interconnect 140 to the recording/reproducing element 103 are formed (FIG. 13E). In such a case, the recording/reproducing element 103 is connected to the control transistor provided on the substrate 500 by the interconnect 140.

Here, in the case where the transistors are provided at the two ends of the magnetic unit 101 as shown in FIG. 4, a method is used in which two substrates in which the transistors are provided are adhered to the arrangement of magnetic units made by anodic oxidation, etc., from above and below. Therefore, high-precision alignment technology between the substrates above and below is necessary.

As one method for avoiding the alignment process between the substrates, a method may be considered in which the arrangement of the magnets having the columnar configurations is made on the arrangement of the transistors, and transistors are stacked on the upper surface of the magnets. However, instead of forming on a monocrystalline silicon substrate, it is necessary to form the transistors on a polycrystalline silicon layer formed on the alumina subjected to the anodic oxidation; and there are problems from the perspective of the characteristics of the transistors, etc.

However, according to a configuration as in the embodiment in which the transistors are provided only on the one side of the magnetic unit 101, the high-precision alignment technology for adhering the substrates above and below to the arrangement of magnetic units is unnecessary. Or, in the case where the magnetic unit arrangement is formed on the silicon substrate in which the transistors are formed, it is unnecessary to form the transistors on the arrangement of magnetic units; and therefore, the degradation of the characteristics of the transistors can be suppressed.

Figure 14A:
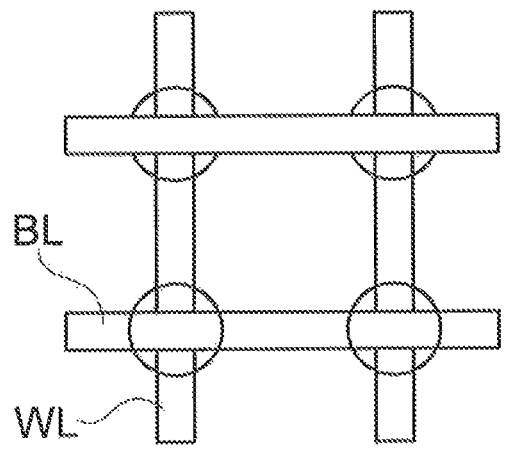
FIGS. 14A and 14B are schematic views of the arrangement of holes for manufacturing the magnetic unit.
Figure 14B:
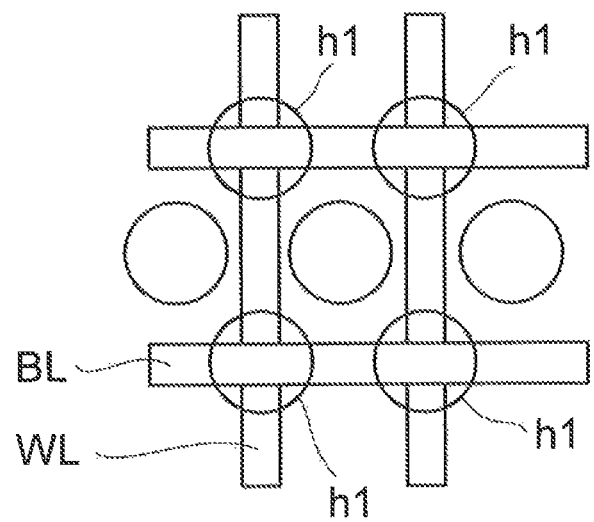

The compatibility between the semiconductor processes is high when the arrangement of holes is made in a lattice configuration as shown in FIG. 14A so that the holes are positioned at the intersections between word lines WL and bit lines BL. However, as shown in FIG. 14B, the growth of the holes is more stable when using a triangular lattice (a hexagonal crystal) in which the holes can be filled with the highest density in the plane. Therefore, as in FIG. 14B, a pseudo-lattice arrangement may be formed in which only some of holes h1 are used and positioned at the intersections between the word lines WL and the bit lines BL after being arranged in the more stable triangular lattice configuration.

Ninth Embodiment

A magnetic memory according to the embodiment will now be described using FIG. 15.

Figure 15:
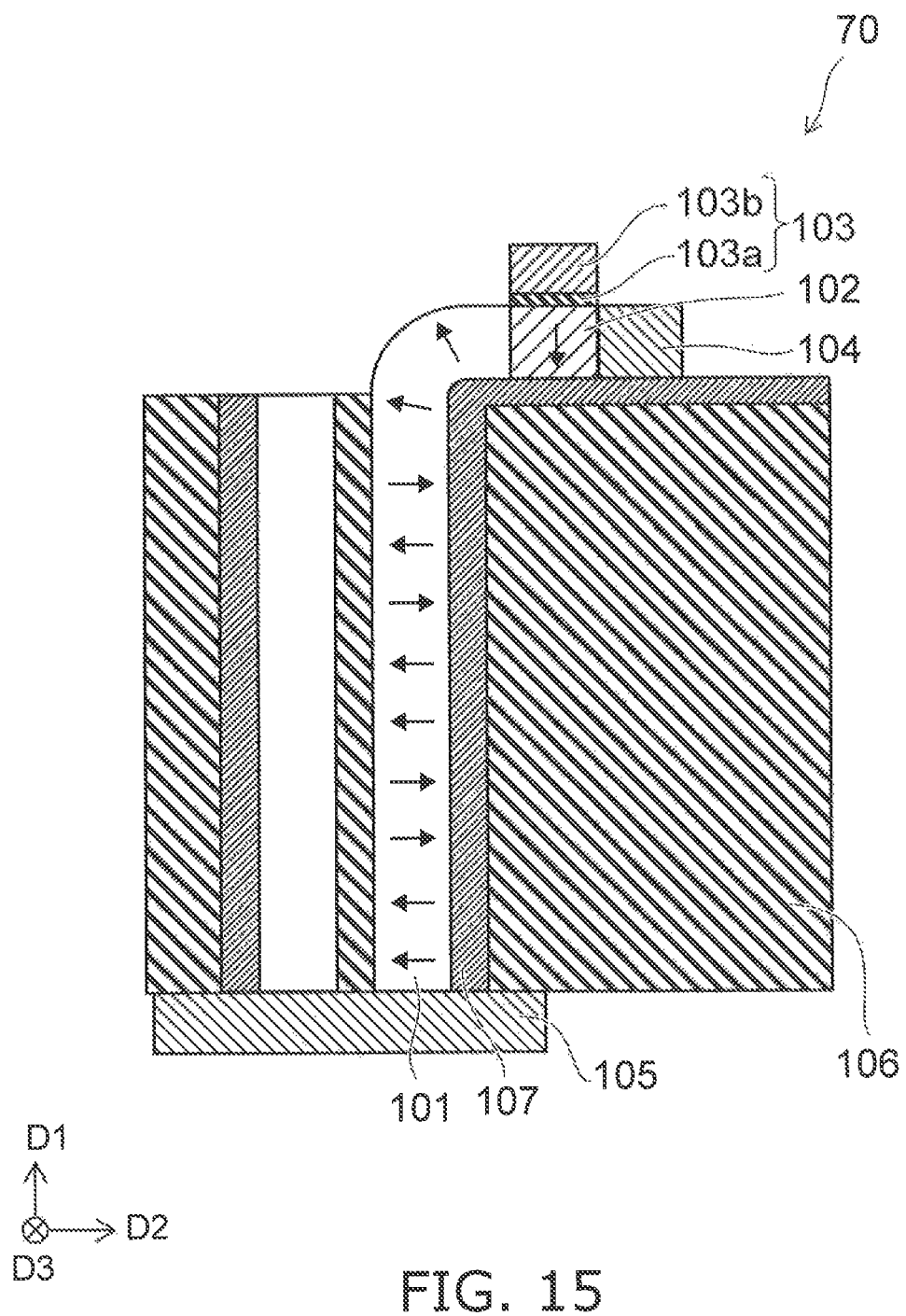
FIG. 15 is a perspective view of the magnetic memory 70 according to the ninth embodiment.

FIG. 15 is a perspective view of the magnetic memory 70 according to the ninth embodiment.

In the magnetic memory 10 according to the first embodiment, the easy magnetization axis of the magnetic layer 102 connected to the magnetic unit 101 is the inner-plane direction. Conversely, in the magnetic memory 70 according to the embodiment, the easy magnetization axis of the magnetic layer 102 is the perpendicular direction (the surface normal direction).

As shown in FIG. 15, in the case where the magnetic layer 102 is connected to the magnetic unit 101 with a sufficiently gradual curvature and the easy magnetization axes of the magnetic unit 101 and the magnetic layer 102 are the perpendicular directions, the shift current can move the magnetic domains between the magnetic unit 101 and the magnetic layer 102 while maintaining the magnetization information in the perpendicular directions.

In such a case, the pinned layer 103b that is included in the recording/reproducing element 103 also has an easy magnetization axis in the perpendicular direction. The magnetization information of the perpendicular direction is written and reproduced to and from the magnetic layer 102 by causing a current to flow between the pinned layer 103b and the first electrode 104.

In the case where the angle of the connection portion between the magnetic unit 101 and the magnetic layer 102 is abrupt, the magnetic domains that include the magnetization information of the perpendicular direction cannot be moved because the domain walls cannot pass through the abrupt connection portion. In such a case, the magnetic domains can move between the magnetic layer 102 and the magnetic unit 101 even if the connection portion is abrupt by setting the length of the magnetic layer 102 to be equivalent to or smaller than the magnetic domain.

Tenth Embodiment

A magnetic memory according to the embodiment will now be described using FIGS. 16A and 16B.

Figure 16A:
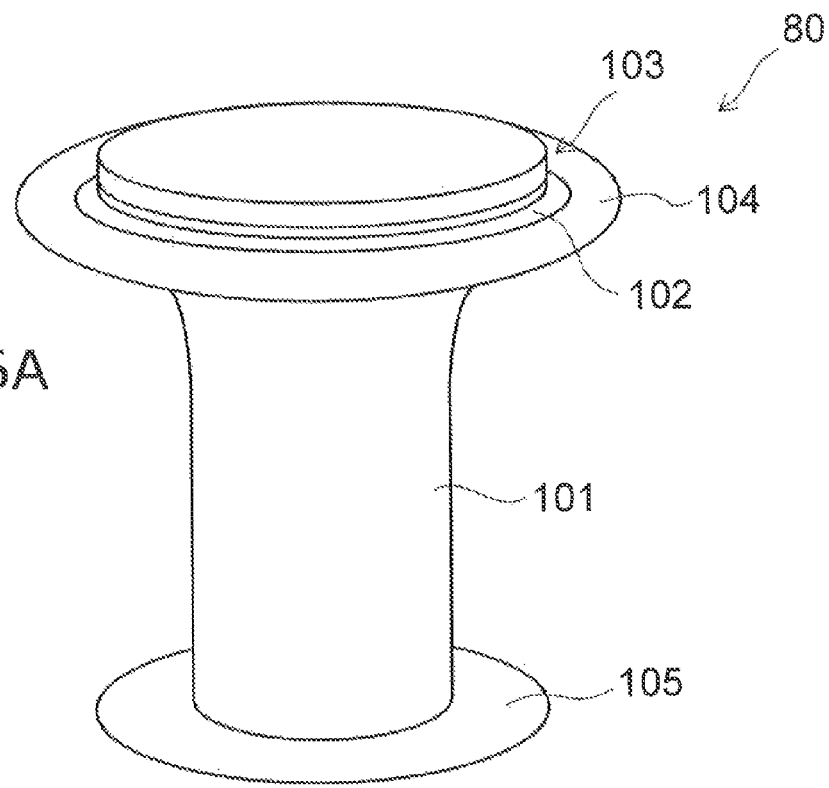
FIG. 16A is a perspective view of the magnetic memory according to the tenth embodiment and FIG. 16B is a cross-sectional view of the magnetic memory according to the tenth embodiment.
Figure 16B:
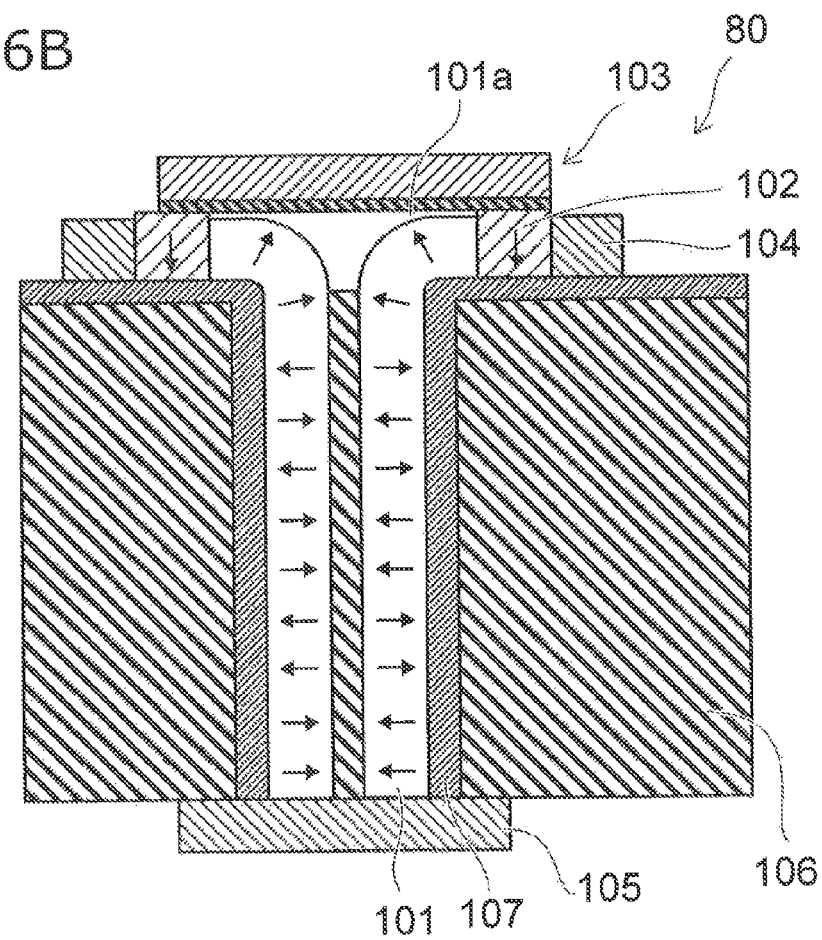

FIG. 16A is a perspective view of the magnetic memory 80 according to the tenth embodiment. FIG. 16B is a cross-sectional view of the magnetic memory 80 according to the tenth embodiment.

In the magnetic memory 70 according to the ninth embodiment, the magnetic layer 102 is connected to only a portion of the first end portion 101a of the magnetic unit 101. Conversely, in the magnetic memory 80 according to the embodiment, the magnetic layer 102 is connected to the magnetic unit 101 at multiple points in a direction intersecting the first direction. In particular, in the magnetic memory shown in FIGS. 16A and 16B, the magnetic layer 102 has an annular configuration and is connected to the magnetic unit 101 in an annular configuration.

The magnetic layer 102 has an annular configuration. The diameter of the magnetic layer 102 is larger than the dimension of the first end portion 101a in the direction intersecting the first direction. The magnetic layer 102 is provided in contact with the outer circumference of the first end portion 101a of the magnetic unit 101. The recording/reproducing element 103 is provided to cover the opening of the magnetic layer 102 having the annular configuration. When viewed from the first end portion 101a side, the magnetic unit 101 is covered with the recording/reproducing element 103. The electrode 104 has an annular configuration and is provided at the outer circumference of the magnetic layer 102 having the annular configuration.

When writing the magnetic domain to the magnetic layer 102, the magnetic domain having an annular configuration is written to the magnetic layer 102 by the recording/reproducing element 103.

The movement of the magnetic domain between the magnetic layer 102 and the magnetic unit 101 is performed by a current flowing between the electrode 105 and the electrode 104 having the annular configuration.

When reproducing the magnetic domain of the magnetic layer 102, the magnetic domain is moved from the magnetic unit 101 into the magnetic layer 102; and the magnetization direction of the magnetic domain having the annular configuration of the magnetic layer 102 is reproduced by causing a current to flow between the recording/reproducing element 103 and the electrode 104.

Because the magnetic domain of the magnetic layer 102 is formed in the annular configuration according to the embodiment, the magnetization direction of the magnetic domain can be more stable than that of the magnetic memory according to the ninth embodiment.

Eleventh Embodiment

A magnetic memory according to the embodiment will now be described using FIG. 17.

Figure 17:
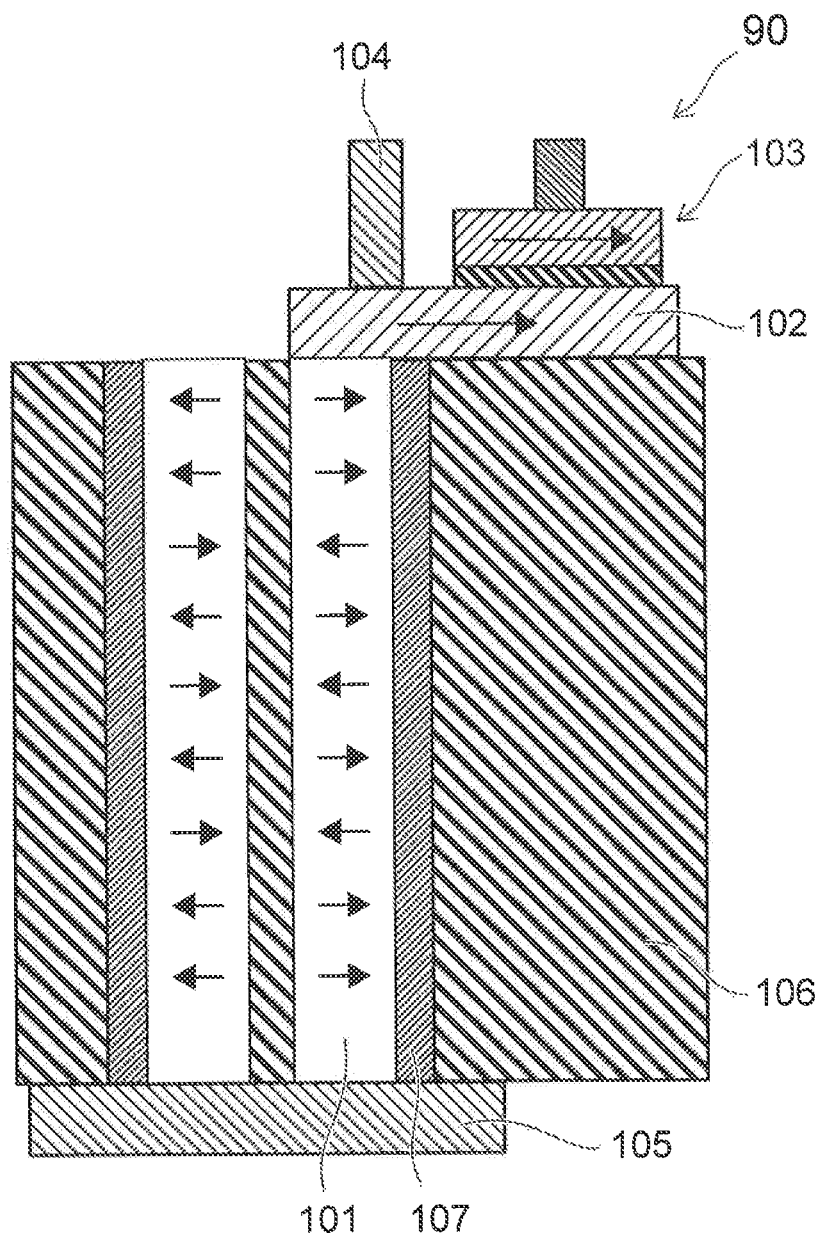
FIG. 17 is a cross-sectional view of the magnetic memory 90 according to the eleventh embodiment.

FIG. 17 is a cross-sectional view of the magnetic memory 90 according to the eleventh embodiment.

In the magnetic memory 10 according to the first embodiment, the electrode 104 is provided so that the portion of the magnetic layer 102 contacting the recording/reproducing element 103 is positioned in the current path between the electrode 104 and the magnetic unit 101. In other words, the electrode 104 is provided so that the portion of the magnetic layer 102 where the recording/reproducing element 103 is provided is positioned in the current path between the electrode 104 and the portion of the magnetic layer 102 connected to the magnetic unit 101.

Conversely, in the magnetic memory 90 according to the embodiment, the portion of the magnetic layer 102 where the recording/reproducing element 103 is provided is not positioned in the current path between the electrode 104 and the portion of the magnetic layer 102 connected to the magnetic unit 101.

The magnetic layer 102 is connected to the first end portion 101a of the magnetic unit 101. The electrode 104 is provided substantially directly above the magnetic unit 101. In other words, when viewed from the first direction, at least a portion of the electrode 104 overlaps the magnetic unit 101.

In the case where the easy magnetization axis of the magnetic layer 102 is the inner-plane direction and the length of the magnetic layer 102 is 200 nm or less, it is difficult for a domain wall to stably exist in the magnetic layer 102. Therefore, the magnetic layer 102 is a single magnetic domain. If the magnetic layer 102 is a single magnetic domain, it is possible to perform the recording/reproducing at any position of the magnetic layer 102. Accordingly, the recording/reproducing element 103 may be provided at any position on the magnetic layer 102.

Generally, the degrees of freedom of the size of the recording/reproducing element (e.g., the MTJ) are lower than those of the electrode; and caution is required to prevent damage in the patterning. Therefore, according to the method for manufacturing the magnetic memory, there are cases where it is desirable for the hole (the magnetic unit) and the electrode to be provided at distal positions. For example, in the case where the recording/reproducing element 103 is formed first on the substrate and the hole is made subsequently on the substrate, there is a possibility that the recording/reproducing element 103 may be damaged if the formation positions of the recording/reproducing element 103 and the hole are proximal. Or, in the case where a metal film is deposited after forming the recording/reproducing element 103 and the metal film is patterned to form the electrode, there is a possibility that the recording/reproducing element 103 may be damaged if the positions of the recording/reproducing element 103 and the electrode are proximal. As in the embodiment, when manufacturing the magnetic memory so that the magnetic unit 101 and the electrode 104 are provided to be proximal and the recording/reproducing element 103 is provided at a position separated from the magnetic unit 101 and the electrode 104, it is possible to suppress the damage of the recording/reproducing element 103.

Note 1

A method for operating a magnetic memory, the magnetic memory including:
a first magnetic unit extending in a first direction, including a plurality of magnetic domains arranged in the first direction, and having a columnar configuration having a hollow portion;
a first magnetic layer connected to a first end portion of the first magnetic unit, the first magnetic layer extending in a direction intersecting the first direction;
a first recording/reproducing element provided in contact with the first magnetic layer;
a first electrode electrically connected to the first magnetic layer; and
a second electrode connected to a second end portion of the first magnetic unit on a side opposite to the first end portion, the method comprising:
moving the magnetic domain of the first magnetic layer toward the first magnetic unit by causing a current to flow from the second electrode toward the first electrode; and
after the moving of the magnetic domain of the first magnetic layer toward the first magnetic unit, causing a current to flow between the first electrode and the first recording/reproducing element via the first magnetic layer to control a magnetization direction of the magnetic domain of the first magnetic layer to be a direction corresponding to the flow direction of the current.

Note 2

A method for operating a magnetic memory,
the magnetic memory including:
a first magnetic unit extending in a first direction, including a plurality of magnetic domains arranged in the first direction, and having a columnar configuration having a hollow portion;
a first magnetic layer connected to a first end portion of the first magnetic unit, the first magnetic layer extending in a direction intersecting the first direction;
a first recording/reproducing element provided in contact with the first magnetic layer;
a first electrode electrically connected to the first magnetic layer; and
a second electrode connected to a second end portion of the first magnetic unit on a side opposite to the first end portion,
the method comprising:
moving the magnetic domains of the first magnetic unit toward the first magnetic layer by causing a current to flow from the first electrode toward the second electrode; and
after the moving of the magnetic domains of the first magnetic layer toward the first magnetic unit, sensing a magnetization direction of the magnetic domain of the first magnetic layer by causing a current to flow between the first electrode and the first recording/reproducing element via the first magnetic layer.

Note 3

A method for manufacturing a magnetic memory, comprising:
making a hole in a base member by performing anodic oxidation by alternately applying a first voltage and a second voltage to the base member, the second voltage being higher than the first voltage, the hole extending in a first direction and having portions provided periodically in the first direction, the portions having a small dimension in a direction intersecting the first direction;
forming a magnetic unit having a columnar configuration having a hollow portion by forming a magnetic material as a layer on an inner wall of the hole;
forming a first magnetic layer connected to one end of the magnetic unit, the first magnetic layer extending in a direction intersecting the first direction; and
forming a first recording/reproducing element in contact with the first magnetic layer.

Note 4

The method according to Note 3, wherein the time the first voltage is applied is longer than the time the second voltage is applied.

Note 5

The method according to Note 3, wherein
a reaction starting point is formed in the prepared base member, and
the anodic oxidation is performed for the base member including the reaction starting point.

Note 6

The method according to Note 3, wherein
a foundation layer is formed on the inner wall of the hole, and
the magnetic material is formed as a layer on the foundation layer.

Note 7

The method according to Note 3, wherein the magnetic unit has an easy magnetization axis in a direction from the inner wall of the hole toward a center of the hole.

Hereinabove, embodiments of the invention are described with reference to specific examples. However, the invention is not limited to these specific examples. For example, one skilled in the art may similarly practice the invention by appropriately selecting specific configurations of components such as the magnetic unit, the magnetic layer, the recording/reproducing element, the electrode, the foundation layer, the selector, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all embodiments practicable by an appropriate design modification by one skilled in the art based on the magnetic memory, the shift register memory, the method for manufacturing the magnetic memory, and the method for operating the magnetic memory described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory, comprising:
a first magnetic unit extending in a first direction, including a plurality of magnetic domains arranged in the first direction, and having a columnar configuration having a hollow portion;
a first magnetic layer connected to a first end portion of the first magnetic unit, the first magnetic layer extending in a direction intersecting the first direction;
a first recording/reproducing element provided in contact with the first magnetic layer;
a first electrode electrically connected to the first magnetic layer; and
a second electrode connected to a second end portion of the first magnetic unit on a side opposite to the first end portion.

2. The memory according to claim 1, further comprising:
a second magnetic layer connected to the first end portion, the second magnetic layer extending in a direction intersecting the first direction;
a second recording/reproducing element provided in contact with the second magnetic layer; and
a third electrode electrically connected to the second magnetic layer,
the first magnetic layer and the second magnetic layer including mutually-independent magnetic domains.

3. The memory according to claim 1, further comprising a second magnetic unit extending in the first direction, including a plurality of magnetic domains arranged in the first direction, and having a columnar configuration having a hollow portion,
the first magnetic layer being connected to a first end portion of the second magnetic unit,
the first electrode being connected to a second end portion of the second magnetic unit on a side opposite to the first end portion.

4. The memory according to claim 1, wherein a nonmagnetic material is provided in the hollow portion of the first magnetic unit.

5. The memory according to claim 1, further comprising:
a second magnetic unit provided inside the first magnetic unit, the second magnetic unit extending in the first direction, including a plurality of magnetic domains arranged in the first direction, and having a columnar configuration having a hollow portion;
a second magnetic layer connected to a first end portion of the second magnetic unit;
a second recording/reproducing element provided in contact with the second magnetic layer;
a third electrode electrically connected to the second magnetic layer;
a fourth electrode connected to a second end portion of the second magnetic unit on a side opposite to the first end portion; and
an insulator provided between the first magnetic unit and the second magnetic unit,
a central axis of the first magnetic unit being the same as a central axis of the second magnetic unit.

6. The memory according to claim 5, wherein a nonmagnetic material is provided in the hollow portion of the second magnetic unit.

7. The memory according to claim 5, wherein the second electrode is electrically connected to the fourth electrode.

8. The memory according to claim 1, wherein
an easy magnetization axis of the first magnetic unit is a direction from an outer wall of the first magnetic unit toward the hollow portion, and
an easy magnetization axis of the first magnetic layer is an inner-plane direction.

9. The memory according to claim 1, wherein
an easy magnetization axis of the first magnetic unit is a direction from an outer wall of the first magnetic unit toward the hollow portion, and
an easy magnetization axis of the first magnetic layer is a direction perpendicular to an inner-plane direction.

10. The memory according to claim 9, wherein the first magnetic layer is connected to the first magnetic unit at a plurality of points in a direction intersecting the first direction.

11. The memory according to claim 10, wherein the first magnetic layer has an annular configuration and is connected to the first magnetic unit in an annular configuration.

12. The memory according to claim 1, wherein the first magnetic unit has a cylindrical configuration.

13. The memory according to claim 1, wherein the first magnetic unit includes portions provided periodically in the first direction, the portions having a small dimension in a direction intersecting the first direction.

14. The memory according to claim 1, wherein the first magnetic unit has a quadrilateral tubular configuration.

15. The memory according to claim 14, wherein the first magnetic unit includes a plurality of magnetic domains arranged in the first direction at each side extending in the first direction, and the sides include mutually-independent magnetic domains.

16. A magnetic memory, comprising:
a first magnetic unit extending in a first direction, including a plurality of magnetic domains arranged in the first direction, and having a columnar configuration having a hollow portion;
a first magnetic layer connected to a first end portion of the first magnetic unit, the first magnetic layer extending in a direction intersecting the first direction;
a second magnetic layer connected to the first end portion, the second magnetic layer extending in a direction intersecting the first direction;
a recording device provided in contact with the first magnetic layer;
a first electrode electrically connected to the first magnetic layer;
a second electrode connected to a second end portion of the first magnetic unit on a side opposite to the first end portion;
a reproducing element provided in contact with the second magnetic layer; and
a third electrode electrically connected to the second magnetic layer,
the first magnetic layer and the second magnetic layer including mutually-independent magnetic domains.

17. A shift register memory, comprising:
a plurality of the magnetic memories according to claim 1;
a plurality of first transistors, each of the first transistors including a gate connected to a first common gate line, one terminal other than the gate connected to the corresponding second electrode, and one other terminal other than the gate connected to a first common interconnect;
a plurality of second transistors, each of the second transistors including a gate connected to a second common gate line, one terminal other than the gate connected to the corresponding first recording/reproducing element, and one other terminal other than the gate connected to a fixed potential; and
a plurality of third transistors, each of the third transistors including a gate connected to a first common gate line, one terminal other than the gate connected to the corresponding first electrode, and one other terminal other than the gate connected to a second common interconnect.

18. A shift register memory, comprising:
a plurality of the magnetic memories according to claim 1;
a plurality of first transistors, each of the first transistors including a gate connected to a first common gate line, one terminal other than the gate connected to the corresponding second electrode, and one other terminal other than the gate connected to a first common interconnect; and
a plurality of second transistors, each of the second transistors including a gate connected to a second common gate line, one terminal other than the gate connected to the corresponding first recording/reproducing element, and one other terminal other than the gate connected to a second common interconnect, a plurality of the first electrodes being connected to a fixed potential.

19. The shift register memory according to claim 18, further comprising an interconnect provided to be arranged with the first magnetic unit, the interconnect extending in the first direction, the one terminal of the second transistor being connected to the corresponding first recording/reproducing element via the interconnect.

20. The shift register memory according to claim 19, wherein the first transistor and the second transistor are provided on the second electrode-side of the first: magnetic unit.

* * * * *